United States Patent
Tasaki et al.

(10) Patent No.: US 6,319,425 B1
(45) Date of Patent: Nov. 20, 2001

(54) TRANSPARENT COATING MEMBER FOR LIGHT-EMITTING DIODES AND A FLUORESCENT COLOR LIGHT SOURCE

(75) Inventors: Masutsugu Tasaki; Akira Ichikawa; Tsutomu Odaki; Kazuhisa Takagi, all of Izumizaki-mura (JP)

(73) Assignees: Asahi Rubber Inc., Saitama; Sanken Electric Co., Ltd., Niiza, both of (JP)

( * ) Notice: Subject to any disclaimer, the term of this patent is extended or adjusted under 35 U.S.C. 154(b) by 0 days.

(21) Appl. No.: 09/499,345

(22) Filed: Feb. 8, 2000

Related U.S. Application Data

(63) Continuation-in-part of application No. 09/110,973, filed on Jul. 7, 1998, now abandoned.

(30) Foreign Application Priority Data

Jul. 7, 1997 (JP) .................................................. 9-181035
Jun. 12, 1998 (JP) .................................................. 10-165598

(51) Int. Cl.⁷ .................................................. H01L 33/00
(52) U.S. Cl. ........................ 252/301.36; 257/98; 313/501; 313/503
(58) Field of Search ..................... 252/301.36; 257/98; 313/501, 503

(56) References Cited

U.S. PATENT DOCUMENTS

| | | |
|---|---|---|
| 3,593,055 | 7/1971 | Geusic et al. .................... 313/108 D |
| 3,932,881 | 1/1976 | Mita et al. ........................... 357/17 |
| 3,959,655 | 5/1976 | Mauer .................................. 250/474 |
| 4,599,537 | 7/1986 | Yamashita ........................... 313/501 |
| 5,655,826 | * 8/1997 | Kouno et al. ........................ 362/24 |
| 5,998,925 | * 12/1999 | Shimizu et al. ..................... 313/503 |
| 6,066,861 | * 5/2000 | Hohn et al. .......................... 257/99 |
| 6,084,250 | * 7/2000 | Justel et al. ......................... 257/89 |

FOREIGN PATENT DOCUMENTS

| | | |
|---|---|---|
| 3804293 | 8/1989 | (DE) . |
| 3804293 | * 9/1989 | (DE) . |
| 7-176794 | * 7/1995 | (JP) . |
| 9750132 | 12/1997 | (WO) . |

OTHER PUBLICATIONS

English abstract for DE 3,804,293.*
Sato et al, "Full–Color Fluorescnet Display Devices Using a Near–UV Light–Emitting Diode", Ja. Jour. App. Phys. vol. 35, pp. 838–839, Jul. 1, 1996.*
Sato Y. et al., "Full–Color Fluorescent Display Devices Using a Near–UV Led," Japanese Journal of Applied Physics, vol. 35, No. 7A, pp. L838–L839, Jul. 1, 1996.

* cited by examiner

*Primary Examiner*—C. Melissa Koslow
(74) *Attorney, Agent, or Firm*—Smith Patent Office

(57) ABSTRACT

This invention relates to a transparent coating member mountable on a light-emitting diode including a fluorescent substance and a light diffusion substance including calcium carbonate in order to reduce color variation at various locations of a transparent coating member and also reduce manufacturing costs of the transparent coating member without significantly lower the level of chromaticity. Furthermore, this invention relates to a transparent coating member mountable on a light-emitting diode (LED) including a fluorescent substance and a light storing pigment. This structure allows an exhibition of afterglow of the transparent coating member after turning off the light in a room so that locating the position of the transparent coating member is made easier thereafter. The light diffusion substance and the light storing pigment can be added to the transparent coating member to acquire both advantages derived from respective substances.

48 Claims, 12 Drawing Sheets

TRANSPARENT COATING MEMBER FOR LIGHT-EMITTING DIODES AND A FLUORESCENT COLOR LIGHT SOURCE

This is a continuation in part application of U.S. patent application Ser. No. 09/110,973 filed on Jul. 7, 1998, now abandoned.

BACKGROUND OF THE INVENTION

1. Field of the Invention

This invention relates to a transparent coating member to be mounted on a light-emitting diode (hereinafter, "LED") and a light source for changing the color of a light emitted from an LED by mounting the coating member on the LED or forming a coating layer containing a fluorescent substance on the surface of the LED.

2. Discussion of the Related Art

As well-known, the LED is a crystal body having a p-n junction. Upon the application of a forward voltage, electrons are injected from the n region to the p-n junction and holes are injected from p region to the p-n junction. A light is emitted when the electrons and holes are recombined. Accordingly, free electrons are combined and energy released during this recombination is radiated as a light. Thus, there exist LEDs of limited colors. In other words, LEDs having a red LED chip emit only a red light; LEDs having a green LED chip emit only a green light; and LEDs having a blue LED chip emit only a blue light.

However, there has recently been a large demand for LEDs capable of changing a light emitted therefrom in order to meet multi-purpose applications. A color changing method for meeting such a demand is, for example, such that a suitable combination of red, green and blue LED chips are set in the LED and the color of the light emitted from the LED is changed by causing a different combination of chips to emit light.

Such an LED results in a complicated constructional design since four terminals: three different anode terminals of the red, green and blue LED chips and a cathode terminal, are necessary. The most fatal problem is that, since three different chips are set in the LED, a color balance is lost if any one of the chips is broken, with the result that a desired color cannot be obtained.

Further, in recent years, a white LED lamp has been proposed in which a layer of YAG (yttrium aluminate) fluophor is provided on a blue LED chip (Nikkei Sangyo Shinbun, Sep. 13, 1991 issue). This white LED lamp is designed to generate a white light by a light excited by the layer of fluophor and the afterglow of the blue LED chip. If a cap or a sheet containing a coloring agent is mounted on such a white LED lamp, a light of a desired color can be obtained.

However, the above white LED lamp has various problems that a high degree of application technique is required due to only a very small amount of fluorescent substance on the blue LED chip, a large variation of the color caused by a slight error and the application of a fine amount, and a price per lamp is very expensive.

SUMMARY OF THE INVENTION

The present invention has been developed as a result of studies to solve the above-mentioned various problems and an object thereof is to provide a transparent coating member for a LED which can easily change the color of a light emitted therefrom to a desired color.

It is another object of the present invention to provide a fluorescent color light source which can easily change the color of a light irradiated therefrom and diffuse the light of a stable color at a high luminance and is easy to maintain and inexpensive.

The invention is directed to a transparent coating member mountable on a light-emitting diode, comprising a fluorescent substance.

The invention is also directed to a fluorescent color light source comprising a light-emitting diode, and a transparent coating portion on the light-emitting diode, the transparent coating portion including a fluorescent substance.

The wavelength of emitted light peculiar to the light-emitting diode is changed by the fluorescent substance contained in the coating portion to change the luminescent color.

On the other hand, it is in reality very difficult to produce LEDs of uniform quality, and the color and luminance of the produced LEDs unavoidably vary. It is a very important problem how such variations can be suppressed without increasing production costs. Up to now, the variations have not yet sufficiently been suppressed.

Furthermore, when a blue LED tip coated with a cap including a fluorescent material is illuminated, there likely occurs a color variation between a lead end and a side surface. In general, the lead end portion becomes blue and the side portion becomes yellow. This phenomenon becomes more significant when the amount of fluorescent materials is reduced.

In addition, the cost of a fluorescent material is dominates the entire cost of a cap used to cover an LED and it thus is essential to reduce the amount of fluorescent material as much as possible.

Moreover, a transparent coating member used for an LED tip may be used in a dark room and it thus is appreciated to have an afterglow on after the light of LED is turned off.

In order to reduce color variation at a location of the transparent coating member, a transparent coating member having a lead end and a side surface mountable on a light-emitting diode (LED) according to this invention comprises a fluorescent substance and a light diffusion substance (LDS).

With the thus constructed transparent coating member, it becomes possible to reduce the color variation between the lead end and the side end surface of the transparent coating member when an LED enclosed therein emits light. At the same time, it was found possible to maintain the same level of chromaticity without significantly lowering luminance by using a reduced amount of fluorescent material and by adding a specific amount of light diffusion substance in the coating member. In short, addition of the light diffusing substance enables a reduction of color variation between positions of the transparent coating member covering an LED tip and a reduction of the amount of fluorescent material.

Another structure of a transparent coating member according to this invention comprises a fluorescent substance and a light storing pigment.

With the above construction, the transparent coating member shows an afterglow on and after turning off the LED enclosed in the coating member. This enables a user to locate the position of the coating member easily after turning off the LED in a dark room.

Yet, another construction of a transparent coating member having an inner surface and an outer surface according to this invention comprises a silicone rubber and an YAG fluophor and the inner and the outer surfaces are finished with a sand blasting process.

With the sand blasting process applied to the inner and, outer surfaces of the coating member, the transparent coating member enables a reduction of color variation and a luminance variation between the lead end and the side surface of the LED.

These and other objects, features and advantages of the present invention will become more apparent upon a reading of the following detailed description and accompanying drawings.

DETAILED DESCRIPTION OF THE PREFERRED EMBODIMENTS OF THE INVENTION

The significant feature of the transparent coating member for an LED according to the invention lies in the fluorescent substance contained therein. As opposed to the prior art method for generating a light of a desired color by applying a fine amount of fluorescent substance to the LED chip, light of a desired color can be generated by mounting the inventive transparent coating member on an LED without necessitating a high level of technique.

The fluorescent substance may be preferably an yttrium aluminate fluophor or perylene fluophor. Further, the coating member may be preferably cap-shaped or sheet-shaped. In the case of the cap-shaped coating member, a light gathering mechanism may be provided at a leading end portion thereof.

Also, a fluorescent color light source is produced by mounting a transparent coating member on a light-emitting diode or forming a coating layer containing a fluorescent substance on the surface of the light-emitting diode to thereby change the wavelength of an emitted light peculiar to the light-emitting diode by the fluorescent substance contained in the coating member or coating layer, and thereby change the luminescent color.

Figure 4:
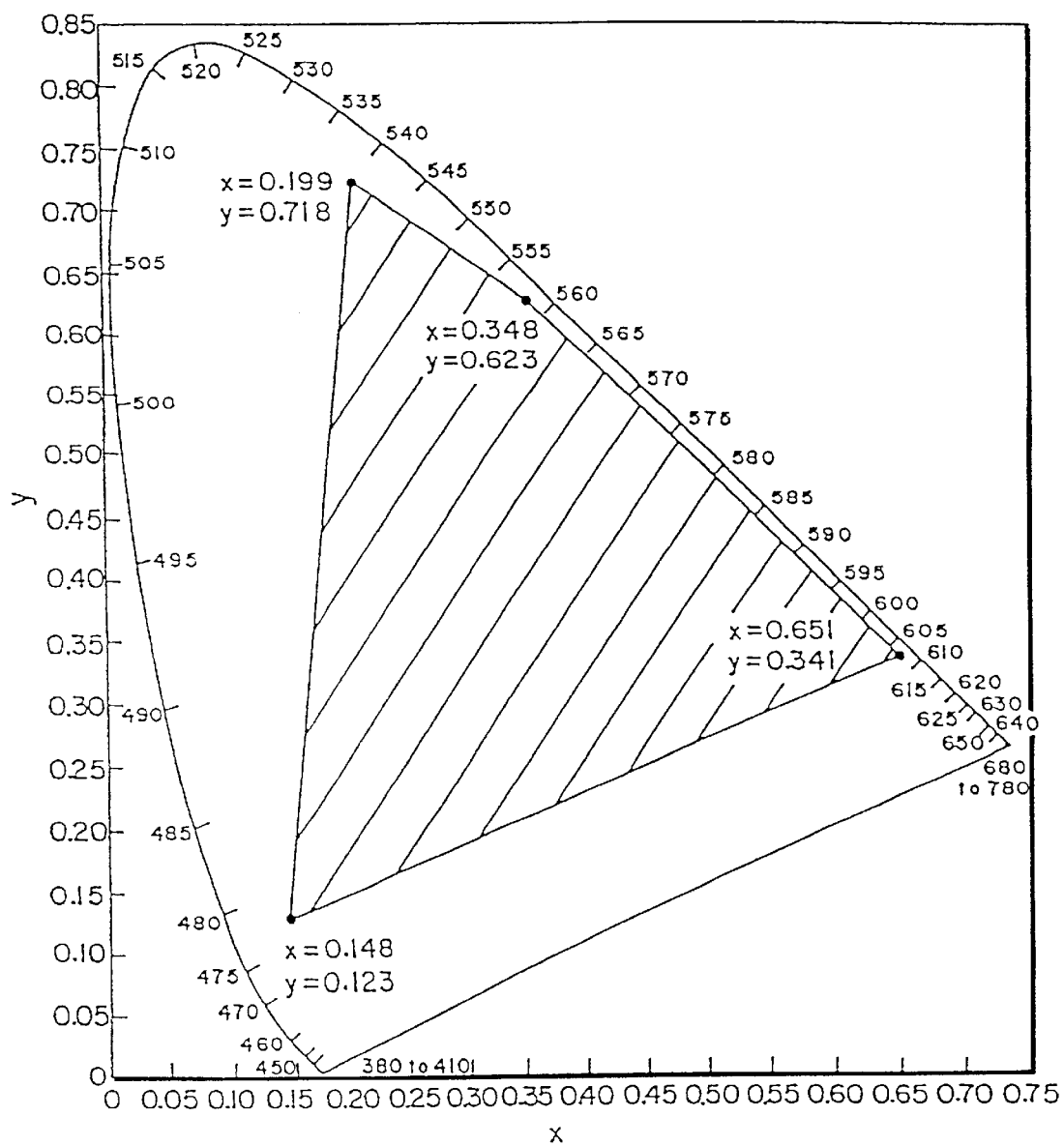
FIG. 4 is a chart showing a variable range of a light diffusely emitted from the fluorescent color source of the invention by CIE (International Committee on Illumination) standard chromaticity diagram.

As shown in FIG. 4, the fluorescent color light source is such that the light diffusely emitted through the coating member or coating layer has a luminescent color within a range defined by (x, y)=(0.148, 0.123), (0.199, 0.718), (0.651, 0.341) and (0.343, 0.623) in chromaticity coordinate systems, and more preferably in a range defined by (x, y)=(0.27, 0.19), (0.19, 0.24), (0.35, 0.48) and (0.48, 0.37) in chromaticity coordinate systems. The fluorescent color light source may be such that a coating member or coating layer containing a coloring agent is further mounted or formed on the coating member or coating layer. Preferably, a holder mechanism may be provided in a desired position of contact surface of the light-emitting diode and the coating member. The light-emitting diode on which the coating member or coating layer may be preferably mounted or formed is a blue light-emitting diode or green light-emitting diode having a high energy.

The color of emitted light to be diffused while passing through the coating member can be adjusted by partially changing the concentration of the fluorescent substance in the coating member. For example, with reference to a production example 33 to be described later, if the fluorescent substance is uniformly and dispersely mixed in a fluorescent color cap, a light emitted through a leading end portion of the cap is: x=0.2346, y=0.2365 and a light emitted through a side surface portion of the cap is: x=0.3095, y=0.3389. In other words, the color of the emitted light differs depending on whether the light passes through the leading end portion of the cap or the side surface portion thereof. If another cap containing a specified amount of fluorescent substance is further mounted on the leading end portion of the cap, i.e. the concentration of the fluorescent substance is changed at the leading end portion and the side surface portion, the light emitted through the leading end portion is: x=03060, y=0.3355 and is the same color as the color of the light emitted through the side surface portion.

Fluorescent substances usable for the inventive transparent coating member for an LED are known fluorescent substances such as fluophors, fluorescent pigments and fluorescent dyes. Organic fluophors include allylsulfoamide-melamine-formaldehyde condensation dyes and perylene fluophors, whereas inorganic fluophors include aluminates, phosphates, silicates. Among these substances, perylene fluophors and yttrium aluminate are particularly preferable since they are usable over a long term.

Additives to be added to the fluophors include, for example, cerium, europium, manganese, gadolinium, samarium, terbium, tin, chromium, etc. Cerium is most preferable among these. An amount of additive is preferably in a range of 0.1 to 10 mol % to the fluophor.

A preferable combination of the fluophor and additive are yttrium aluminate and cerium.

The mode of the inventive transparent coating member for an LED is not particularly limited and come, for example, in a caplike shape and a sheetlike shape in conformity with the shape of the LED. In order to make the coating member into a caplike shape, for example, the fluorescent substance and a bonding resin may be mixed and the resulting mixture may be molded using a mold and a heat press. In order to make the coating member into a sheetlike shape, the fluorescent substance and a bonding resin may be melted and kneaded and may be molded according to an inflation method, T-die extrusion, solvent casting, calendering. Further, a sheetlike shape may be realized by coating the fluorescent substance on a base sheet made of a plastic film. As such a coating method may be adopted a method for applying a fluorescent substance dissolved in an organic solvent to the base sheet and drying it by hot air or a method for applying a synthetic resin emulsion to the base sheet and drying it to form a polymer film thereon.

Figure 5:
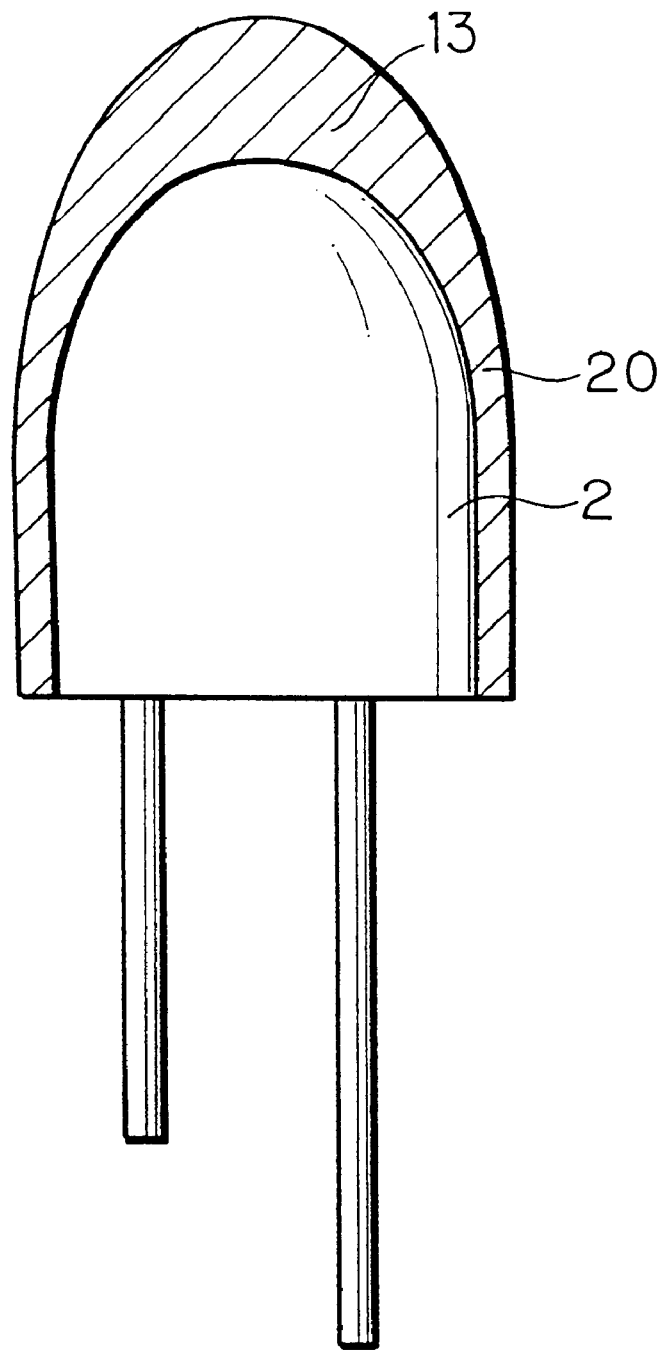
FIG. 5 is a section of a fluorescent color cap according to the invention in which a light gathering mechanism is provided at its leading end portion.

In the case that the transparent coating member for an LED is cap-shaped, a light gathering mechanism may be provided at its leading end portion. Luminance can be increased by such a mechanism, thereby achieving an efficient illumination with a little energy. The light gathering mechanism may be constructed, for example, by a lens construction. A specific example of construction is shown in FIG. 5. A light gathering portion may be provided at the leading end portion 13 (as a lens portion) of the fluorescent color cap 20 by being integrally molded with other parts using a mold in which the leading end portion is thicker than the other parts or by adhering or mounting a separately manufactured light gathering portion on the leading end portion 13 of the cap 20.

An amount of the fluorescent substance used in the coating member is preferably in a range of 0.0001 to 10 weight parts in the case of organic fluophor and in a range of 0.5 to 70 weight parts in the case of inorganic fluophor per 100 weight parts of bonding resin.

Resins usable for the coating member according to the invention include, for example, acrylic resin, polycarbonate resin, polystyrene resin, polyester resin, epoxy resin, polypropylene resin, polyethylene resin, silicone elastomer, polystyrene thermoplastic elastomer, polyolefin thermoplastic elastomer, polyurethane thermoplastic elastomer. Among these, silicone elastomer and the like are preferably usable.

Any known LED can be used as an LED used in the present invention. For example, Ga:ZnO red LED, GAP:N green LED, GaAsP red LED, GaAsP orange/yellow LED, GaAlAs LED, InGaAlP orange/yellow LED, GaN blue LED, SiC blue LED, II–VI blue LED may be used.

Further, the LED comes in any mode. For example, a LED lamp, a chip type LED or a segment type LED, etc. may preferably be used.

The wavelength of the light emitted from the LED can be changed to a desired one by mounting the above coating member on the LED or forming a coating layer containing a fluorescent substance on the surface of the LED.

Figure 1:
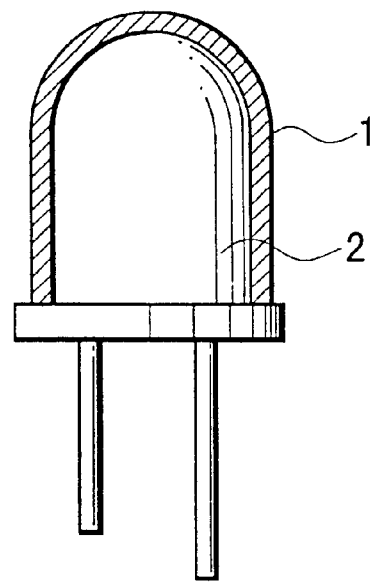
FIG. 1 is a schematic section of a fluorescent color light source in which a fluorescent color cap as a coating member (cap-shaped) of the invention is mounted on a lamp-type LED.
Figure 2:
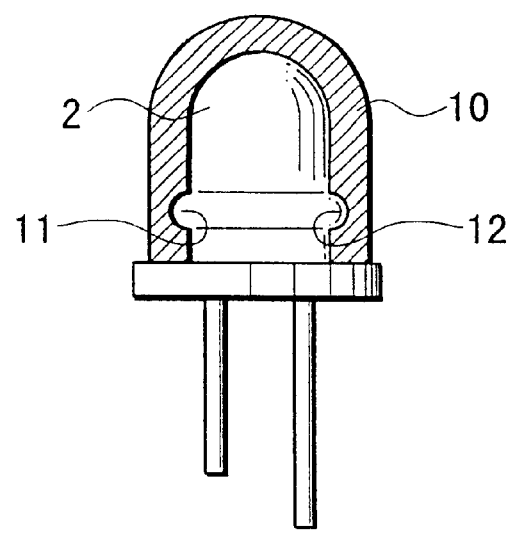
FIG. 2 is a schematic section of a fluorescent color light source in which a fluorescent color cap as another coating member (cap-shaped) of the invention is mounted on the lamp-type LED.

In order to mount the coating member on the LED, it may be engaged with the LED in the case of a cap-shaped coating member. In order to more securely mount the coating member, a holder mechanism may be provided at a peripheral portion of the coating member. With reference to FIG. 1, an inventive coating member (cap) 1 containing a fluorescent substance is directly detachably mounted on an LED 2. Since a cap 10 shown in FIG. 2 is relatively hard, a recess 11 is formed in the cap 10 and a projection 12 is formed on the LED 2 in order to prevent a relative displacement and a disengagement when the cap 10 is mounted on the LED 2. The cap 10 and the LED 2 are disengageably engaged with each other by one operation. The recess 11 and the projection 12 may have an annular configuration along the circumference of the cap or may be formed in a plurality of positions along a circumferential direction at specified intervals. Further, the recess 11 and the projection 12 may be formed on the LED 2 and the cap 10, respectively, converse to the former construction.

Figure 3A:
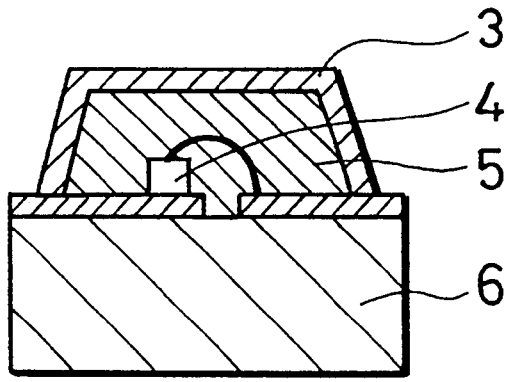
FIGS. 3A and 3B are schematic sections of fluorescent color light sources in which a coating member (sheet-shaped) as still another embodiment of the invention is mounted on a chip-type LED and a segment-type LED, respectively.
Figure 3B:
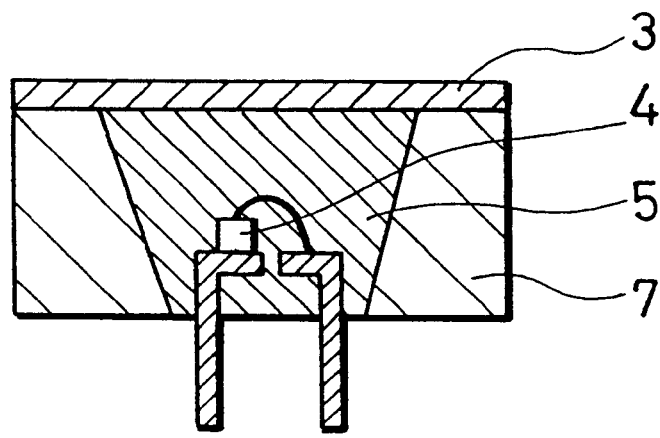

In the case of the sheet-shaped coating member, it may be placed on the surface of the LED. At this time, it is preferable to adhere the sheet-shaped coating member to the LED. A known method such as a thermal adhesion, ultrasonic sealing, high-frequency bonding or a gluing using an adhesive or the like may be used as a method for adhering the sheet-shaped coating member to the LED. Here, in order to improve adhesiveness, the surface of the sheet-shaped coating member may be oxidized by chemicals or by being subjected to gas flames or by means of corona discharge by being brought into contact with a surface electrode. For example, FIGS. 3A and 3B are side views in section of fluorescent color light sources in which sheet-shaped coating members are mounted on LEDs. A sheet-shaped coating member 3 is mounted on a chip type LED 4 and the chip type LED 4 is placed on a base 6 as shown in FIG. 3A, while a sheet-shaped coating member 3 is mounted on a segment type LED 4 in FIG. 3B.

In order to form a coating layer containing the fluorescent substance on the surface of the LED, a known method such as a resin coating or a printing method may be adopted. For example, a bonding resin may be dissolved in a solvent and coated on the surface of the LED after the fluorescent substance is added thereto. A numeral 5 in both FIGS. 3A and 3B denotes a resin, a numeral 6 in FIG. 3A denotes a base (or base plate), and a numeral 7 in FIG. 3B denotes a reflection frame.

The color of the light diffusely emitted from the LED having the coating member mounted thereon or having the coating layer formed thereon is preferably in a range defined by (x, y)=(0.148, 0.123), (0.199, 0.718), (0.651, 0.341), (0.343, 0.623) in the chromaticity coordinate systems. If the emission would fall within such a range, a variety of illuminations could be realized and a color reproduction as a video image is thought to be sufficient. Further, if the color of the emitted light is in a range defined by (x, y)=(0.27, 0.19), (0.19, 0.24), (0.35, 0.48), (0.48, 0.37) in the chromaticity coordinate systems, i.e. it is close to white, the color of the emitted light can easily be adjusted to a desired color.

In other words, if the color of the light emitted from the LED is adjusted to white by mounting or forming the coating member or coating layer, the emitted light can be adjusted to have a desired color by using a coloring agent. In such a case, the coloring agent may be contained in the coating member or coating layer together with the fluorescent substance or a separate coating member or coating layer containing the coloring agent may further be mounted or formed thereon.

The following can be used as a coloring agent. For example, yellow led, yellow zinc, cadmium yellow, yellow iron oxide, mineral fast yellow, nickel titanium yellow, naphthol yellow S (also know as Acid Yellow S (organic yellow pigment (Nitro Pigment C.I. 10316)), Hansa yellow G (also known as Fast Yellow G or Lithosol Fast Yellow HL, organic yellow pigment (Azo pigment C.I. 11680)), Hansa yellow 10G (also known as Fast Yellow 10G or Monolite Fast Yellow 10G, organic yellow pigment (Azo pigment C.I. 11710)), benzidine yellow G (also known as Vulcan Fast Yellow G, organic yellow pigment (Azo pigment C.I. 21095)), benzidine yellow GR (also known as Vulcan Fast Yellow GR or Permanent Yellow GR, organic yellow pigment (Azo pigment C.I. 21100)), quinoline yellow lake (Acid dye lake C.I. 47005), permanent yellow NCG (Azo pigment C.I. 20040), tartrazine lake (Azo pigment C.I. 19140) can be used as a yellow pigment. Chrome orange ($PbCrO_4 \cdot PbO$ (Inorganic pigment C.I. 77601)), molybdenum orange, permanent orange GTR (Azo pigment C.I. 12305), pyrazolone orange, vulcan orange (also known as Benzidine Orange 2G (Azo pigment C.I. 21165)), benzidine orange G (also known as Permanent Orange G, Vulcan Fast Orange G or PV-Orange G (Azo pigment C.I. 21110)) can be used as an orange pigment. Condensation azo dye, red iron oxide, cadmium red ($CdS+CdSe$ (Inorganic pigment C.I. 77202)), red lead, cadmium mercuric sulfide, permanent red 4R (also known as Toluidine Red, Lake Red 4R, Hansa Scarlet RGN, RN, RNC, Hansa Red B or Helio Red Toner RL (Azo pigment C.I. 12120)), lithol red (Azo pigment C.I. 15630), pyrazolone red (also known as Vulcan Fast Red B (Azo pigment C.I. 21120)), watching red calcium salt, lake red D (also known as Bronze Red D (Azo pigment C.I. 15500)), brilliant-carmine 6B (also known as Lithol Rubine BK or Permanent Red F6R, organic red pigment (Azo Pigment C.I. 15850)), eosine lake (Acid dye lake C.I. 45380), rhodamine lake B (also known as Rose Lake B (Basic dye lake C.I. 45170)), alizarin lake, brilliant-carmine 3B (also known as Madder Lake, organic red pigment (dye pigment C.I. 58000)) can be used as a red pigment. Manganese violet, fast violet B (organic purple pigment (Azo pigment)), methyl violet lake can be used as a violet pigment. Iron blue, cobalt blue, alkali blue lake, Victoria blue lake, phthalocyanine blue, metal-free phthalocyanine blue, phthalocyanine blue partial chloride, fast sky blue (organic blue pigment (Phthalocyanine Pigment C.I. 74180)) can be used as a blue pigment. Chrome green, chromium oxide, pigment green B, malachite green lake can be used as a green pigment. Hydrozincite, titanium oxide, antiony white, zinc sulfide, barite powder, barium carbonate, clay, silica, white carbon, talc, alumina white can be used as a white pigment. It is appropriate to use the above coloring agents in a range of 0.001 to 0.1 weight part, particularly 0.01 to 0.05 weight parts per 100 weight parts of bonding resin.

The LED on which the above coating member or coating layer are mounted or formed is preferably a blue LED having a high energy. However, it may be a green LED or other LED.

By using the coating member according to the invention, the luminescent color can finely be adjusted. For example, this coating member makes LEDs having an emitted light beyond a permissible range due to a variation during the manufacturing into a one having an emitted light within this permissible range. With reference to a production example 34, a desired luminescent color within a range of $x=0.2886$ to $0.3046$, $y=0.3102$ to $0.3165$ can be obtained by mounting a fluorescent color cap containing 10.0 parts of YAG fluophors, 10.5 parts thereof, 11.0 parts thereof, and 11.5 parts thereof on the LED when, for example, a current flowing into a blue LED is 5 mA, 10 mA, 20 mA and 30 mA, respectively. It should be noted that the observation or measurement was carried out by means of a spectrophotometer "PR-704" through an integrating sphere or not through an integrating sphere.

EXAMPLES

Production Example 1

1.5 parts of NKP-8306 (fluophor produced by Nippon Keiko Kagakusha, which is a yellow orange organic fluorescent pigment) were dispersed as fluorescent substance in silicone rubber, and a fluorescent color cap having a thickness of 0.5 mm was molded using a mold and a heat press. Further, a blue LED which emits a light defined by $x=0.1490$, $y=0.1203$ in accordance with the CIE (Committee on International Illumination) standard calorimetric system (hereinafter, "chromaticity coordinate systems") was used. When this blue LED was caused to emit a light with the fluorescent color cap mounted thereon, a diffused white light having a yellow tint which is defined by $x=0.3912$, $y=0.4322$ in the chromaticity coordinate systems was observed. In this example, the measurement was carried out through the integrating sphere.

Production Example 2

An amount of NKP-8306 (fluophor produced by Nippon Keiko Kagakusha) added was changed from 1.25 parts to 1.07 parts to 0.94 parts to 0.83 parts, and to 0.75 parts. These various amounts of NKP-8306 were dispersed as fluorescent substance in silicone rubber, and fluorescent color caps having a thickness of 0.5 mm were molded using the same mold and heat press as the example 1. Further, these fluorescent color caps were mounted on blue LEDs which emit a light defined by $x=0.1490$, $y=0.1203$ in accordance with the chromaticity coordinate systems, and the blue LEDs were caused to emit a light. TABLE-1 below shows the resulting colors of the diffused emitted lights. In this example, the measurement was carried out through the integrating sphere.

TABLE-1

| Fluorescent Substance | Chromaticity Coordinates | Luminescent Color |
| --- | --- | --- |
| 1.25 Parts Dispersed | $X = 0.3752$ $Y = 0.4153$ | White |
| 1.07 Parts Dispersed | $X = 0.3460$ $Y = 0.3901$ | White |
| 0.94 Parts Dispersed | $X = 0.3319$ $Y = 0.3780$ | White |
| 0.83 Parts Dispersed | $X = 0.3094$ $Y = 0.3536$ | White having a blue tint |
| 0.75 Parts Dispersed | $X = 0.2916$ $Y = 0.3368$ | White having a blue tint |

As is clear from the results of TABLE-1, it was confirmed that the amount of fluorescent substance added could control the luminescent color. Particularly in the above case, it was observed that luminance of the emitted light was highest at 70 $cd/m^2$ when 1.25 parts of fluorescent substance was dispersed. The thickness of the fluorescent color cap according to the invention may be uniform or may partially be varied to diffuse the light or change the color thereof. Fluorescent color cap can be designed according to the purpose.

Production Example 3

NKP-8306 (fluophor produced by Nippon Keiko Kagakusha) and gadolinium oxide as an additive were mixed at a ratio of 10:2. This mixture was dispersed in 0.75 parts of silicone rubber and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a blue tint which is defined by x=0.2971, y=0.3485 in the chromaticity coordinate systems was observed. In this example, the measurement was carried out through the integrating sphere.

Production Example 4

NKP-8306 (fluophor produced by Nippon Keiko Kagakusha) and gadolinium oxide as an additive were mixed at a ratio of 10:4. This, mixture was dispersed in 0.75 parts of silicone rubber and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a blue tint which is defined by x=0.2985, y=0.3529 in the chromaticity coordinate systems was observed. In this example, the measurement was carried out through the integrating sphere.

Production Example 5

NKP-8306 (fluophor produced by Nippon Keiko Kagakusha) and gadolinium oxide as an additive were mixed at a ratio of 10:6. This mixture was dispersed in 0.75 parts of silicone rubber and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a blue tint which is defined by x=0.3090, y=0.3679 in the chromaticity coordinate systems was observed. In this example, the measurement was carried out through the integrating sphere.

Production Example 6

NKP-8306 (fluophor produced by Nippon Keiko Kagakusha) and gadolinium oxide as an additive were mixed at a ratio of 10:8. This mixture was dispersed in 0.75 parts of silicone rubber and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a blue tint which is defined by x=0.3138, y=0.3734 in the chromaticity coordinate systems was observed. In this example, the measurement was carried out through the integrating sphere.

Production Example 7

NKP-8306 (fluophor produced by Nippon Keiko Kagakusha) and gadolinium oxide as an additive were mixed at a ratio of 10:10. This mixture was dispersed in 0.75 parts of silicone rubber and a fluorescent color cap having a thickness of 0.5 mm was molded using a mold and a heat press. When this color cap was mounted on a blue LED which emits a light defined by x=0.1490, y=0.1203 in the chromaticity coordinate systems, a diff-used white light having a blue tint which is defined by x=0.3254, y=0.3890 in the chromaticity coordinate systems was observed. In this example, the measurement was carried out through the integrating sphere.

As is clear from the results of the luminescent colors of the examples 3 to 7 described above, it was confirmed that a wavelength of the blue LED is more effectively excited by increasing an added amount of gadolinium.

Production Example 8

5 parts of StellarGreen E-8 (fluophor produced by Swada (London) Limited, which is a green organic fluorescent pigment) were dispersed as fluorescent substance in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused vivid green light defined by x=0.1935, y=0.7179 in the chromaticity coordinate systems was observed. In this example, the measurement was carried out through the integrating sphere.

Production Example 9

1.5 parts of StellarGreen E-8 (fluophor produced by Swada) were dispersed as fluorescent substance in silicone rubber, and a fluorescent color cap having a thickness of 0.5 mm was molded using-a mold and a heat press. When this color cap was mounted on a blue LED which emits a light defined by x=0.1490, y=0.1203 in the chromaticity coordinate systems, a diffused blue green light defined by x=0.1928, y=0.5244 in the chromaticity coordinate systems was observed. In this example, the measurement was carried out through the integrating sphere.

Production Example 10

5 parts of Blaze E-S (fluophor produced by Swada (London) Limited, which is a yellow orange organic fluorescent pigment) were dispersed as fluorescent substance in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused red light defined by x=0.6505, y=0.3414 in the chromaticity coordinate systems was observed. In this example, the measurement was carried out through the integrating sphere.

Production Example 11

5 parts of LunaryYellow E-27 (fluophor produced by Swada (London) Limited, which is a yellow organic fluorescent pigment) were dispersed as fluorescent substance in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused yellow green light defined by x=0.3475, y=0.6231 in the chromaticity coordinate systems was observed. In this example, the measurement was carried out through the integrating sphere.

Production Example 12

1.5 parts of NKP-8304 (fluophor produced by Nippon Keiko Kagakusha, which is an orange organic fluorescent pigment) were dispersed as fluorescent substance in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused pink light defined by x=0.5165, y=0.3536 in the chromaticity coordinate systems was observed. In this example, the measurement was carried out through the integrating sphere.

Production Example 13

1.5 parts of NKP-8301 (fluophor produced by Nippon Keiko Kagakusha, which is a red orange organic fluorescent pigment) were dispersed as fluorescent substance in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused reddish violet light defined by x=0.4730, y=0.2890 in the chromaticity coordinate systems was observed. In this example, the measurement was carried out through the integrating sphere.

Production Example 14

1.5 parts of NKP-8301 (fluophor produced by Nippon Keiko Kagakusha) were dispersed as fluorescent substance in silicone rubber, and a fluorescent color cap having a thickness of 0.5 mm was molded using a mold and a heat press. When this color cap was mounted on a green LED which emits a light defined by x=0.4686, y=0.5282 in the chromaticity coordinate systems, a diffused orange light defined by x=0.5720, y=0.4253 in the chromaticity coordinate systems was observed. In this example, the measurement was carried out through the integrating sphere.

Production Example 15

1.5 parts of NKP-8304 (fluophor produced by Nippon Keiko Kagakusha) were dispersed as fluorescent substance in silicone rubber, and a fluorescent color cap having a thickness of 0.5 mm was molded using a mold and a heat press. When this color cap was mounted on a green LED which emits a light defined by x=0.4686, y=0.5282 in the chromaticity coordinate systems, a diffused orange light having a yellow tint which is defined by x=0.5457, y=0.4522 in the chromaticity coordinate systems was observed. In this example, the measurement was carried out through the integrating sphere.

Production Example 16

NKP-8315 (fluophor produced by Nippon Keiko Kagakusha, which is a yellow organic fluorescent pigment) and NKP-8304 (fluophor produced by Nippon Keiko Kagakusha) were mixed as fluorescent substance at a ratio of 10:1. 0.75 parts of this mixture were dispersed in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a green tint which is defined by x=0.3486, y=0.4595 in the chromaticity coordinate systems was observed. In this example, the measurement was carried out through the integrating sphere.

Production Example 17

NKP-8315 (fluophor produced by Nippon Keiko Kagakusha) and NKP-8304 (fluophor produced by Nippon Keiko Kagakusha) were mixed as fluorescent substance at a ratio of 10:3. 0.75 parts of this mixture were dispersed in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a yellow tint which is defined by x=0.4107, y=0.4198 in the chromaticity coordinate systems was observed. In this example, the measurement was carried out through the integrating sphere.

Production Example 18

NKP-8315 (fluophor produced by Nippon Keiko Kagakusha) and NKP-8304 (fluophor produced by Nippon Keiko Kagakusha) were mixed as fluorescent substance at a ratio of 10:5. 0.75 parts of this mixture were dispersed in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having an orange tint which is defined by x=0.4445, y=0.4070 in the chromaticity coordinate systems was observed. In this example, the measurement was carried out through the integrating sphere.

Production Example 19

NKP-8315 (fluophor produced by Nippon Keiko Kagakusha) and NKP-8304 (fluophor produced by Nippon Keiko Kagakusha) were mixed as fluorescent substance at a ratio of 10:10. 0.75 parts of this mixture were dispersed in silicone rubber, and a fluorescent color cap having a thickness of 0.5 mm was molded using a mold and a heat press. When this color cap was mounted on a blue LED which emits a light defined by x=0.1490, y=0.1203 in the chromaticity coordinate systems, a diffused white light having a red tint which is defined by x=0.4634, y=0.3839 in the chromaticity coordinate systems was observed. In this example, the measurement was carried out through the integrating sphere.

As is clear from the results of the diffused lights seen in the production examples 16 to 19, the color of the LED can freely be changed by arbitrarily changing a combination of a variety of fluorescent substances and a mixing ratio and a concentration thereof.

Production Example 20

1.5 parts of NKP-8306 (fluophor produced by Nippon Keiko Kagakusha) were dispersed as fluorescent substance in Akylbet MD (Mitsubishi Rayon Co., Ltd.) which is an acrylic resin, and a fluorescent color cap having a thickness of 0.5 mm was molded using a mold and a heat press. When this color cap was mounted on a blue LED which emits a light defined by x=0.1490, y=0.1203 in the chromaticity coordinate systems, a result similar to that of the example 1 was obtained. In this example, the measurement was carried out through the integrating sphere.

Production Example 21

1.5 parts of NKP-8306 (fluophor produced by Nippon Keiko Kagakusha) were dispersed as fluorescent substance in Mitsubishi Polyethy-HD HJ390 (Mitsubishi Chemical Co., Ltd.) which is a high density polystyrene, and a fluorescent color cap having a thickness of 0.5 mm was molded using a mold and a heat press. When this color cap was mounted on a blue LED which emits a light defined by x=0.1490, y=0.1203 in the chromaticity coordinate systems, a result similar to that of the example 1 was obtained. In this example, the measurement was carried out through the integrating sphere.

Production Example 22

1.5 parts of NKP-8306 (fluophor produced by Nippon Keiko Kagakusha) were dispersed as fluorescent substance in Cepton 2043 (Kuraray Co., Ltd.) which is a styrene thermoplastic elastomer, and a fluorescent color cap having a thickness of 0.5 mm was molded using a mold and a heat press. When this color cap was mounted on a blue LED which emits a light defined by x=0.1490, y=0.1203 in the chromaticity coordinate systems, a result similar to that of the example 1 was obtained. In this example, the measurement was carried out through the integrating sphere.

Production Example 23

40 parts of YAG fluophor (yttrium 28.0 wt %, aluminum 13.6 wt %, gadolinium 56.62 wt %, cerium 1.23 wt %), were dispersed as fluorescent substance in a silicone rubber, and a fluorescent color cap having a thickness of 0.6 mm was molded using a mold and a heat press.

Figure 6:
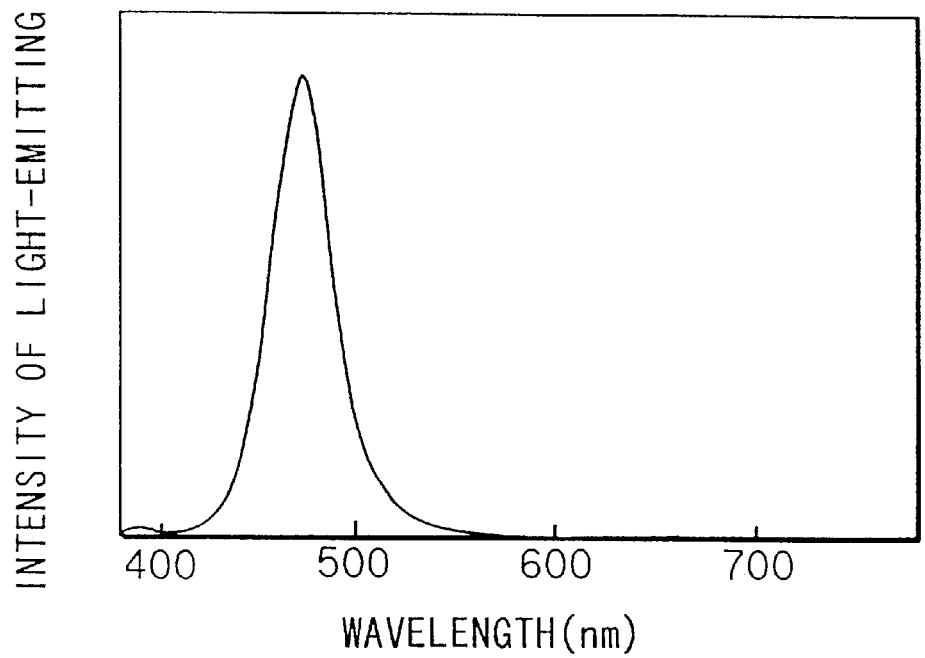
FIG. 6 is a graph showing a spectral wavelength of a blue LED used in a production example 23.
Figure 7:
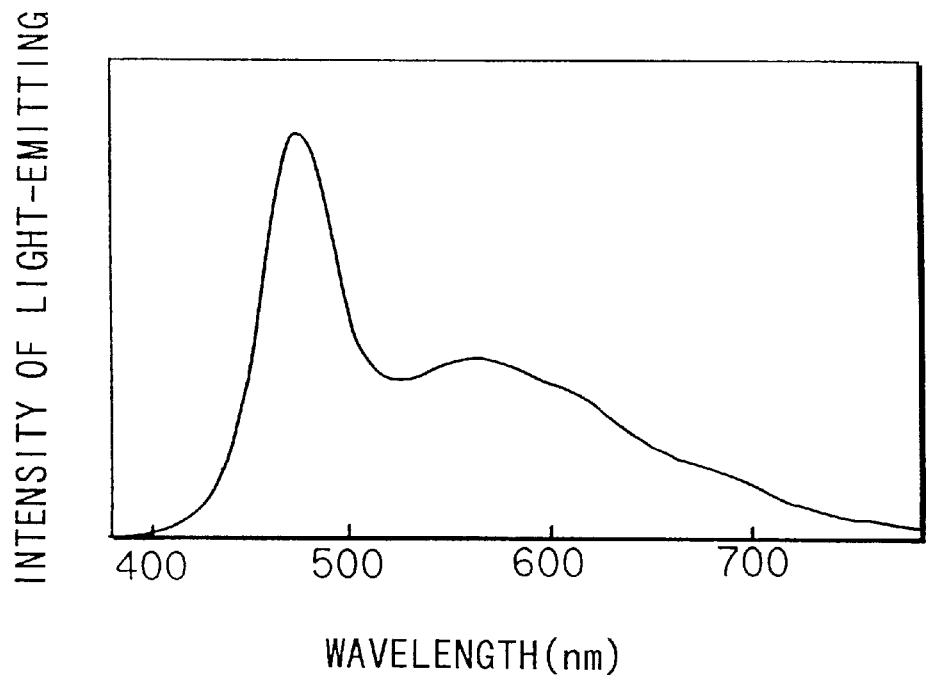
FIG. 7 is a graph showing a spectral wavelength when the fluorescent color cap is mounted on the blue LED in the production example 23.

Further, a blue LED which emits a light defined by x=0.1275, y=0.0883 in accordance with the chromaticity coordinate systems and having a luminance of 28.95 cd/m$^2$ was used. FIG. 6 shows a spectral wavelength of this blue LED. When this blue LED was caused to emit a light with the fluorescent color cap mounted thereon, a diffused white light defined by x=0.3192, y=0.3375 in the chromaticity coordinate systems and having a luminance of 66.36 cd/m$^2$ was observed. The spectral wavelength at this time is shown in FIG. 7. In this example, the measurement was carried out through the integrating sphere.

Production Example 24

12.5 parts of YAG fluophor (yttrium 28.0 wt %, aluminum 13.6 wt %, gadolinium 56.62 wt %, cerium 1.23 wt %), were dispersed as fluorescent substance in silicone rubber, and an elastic sheet having a thickness of 0.5 mm was produced.

Figure 8:
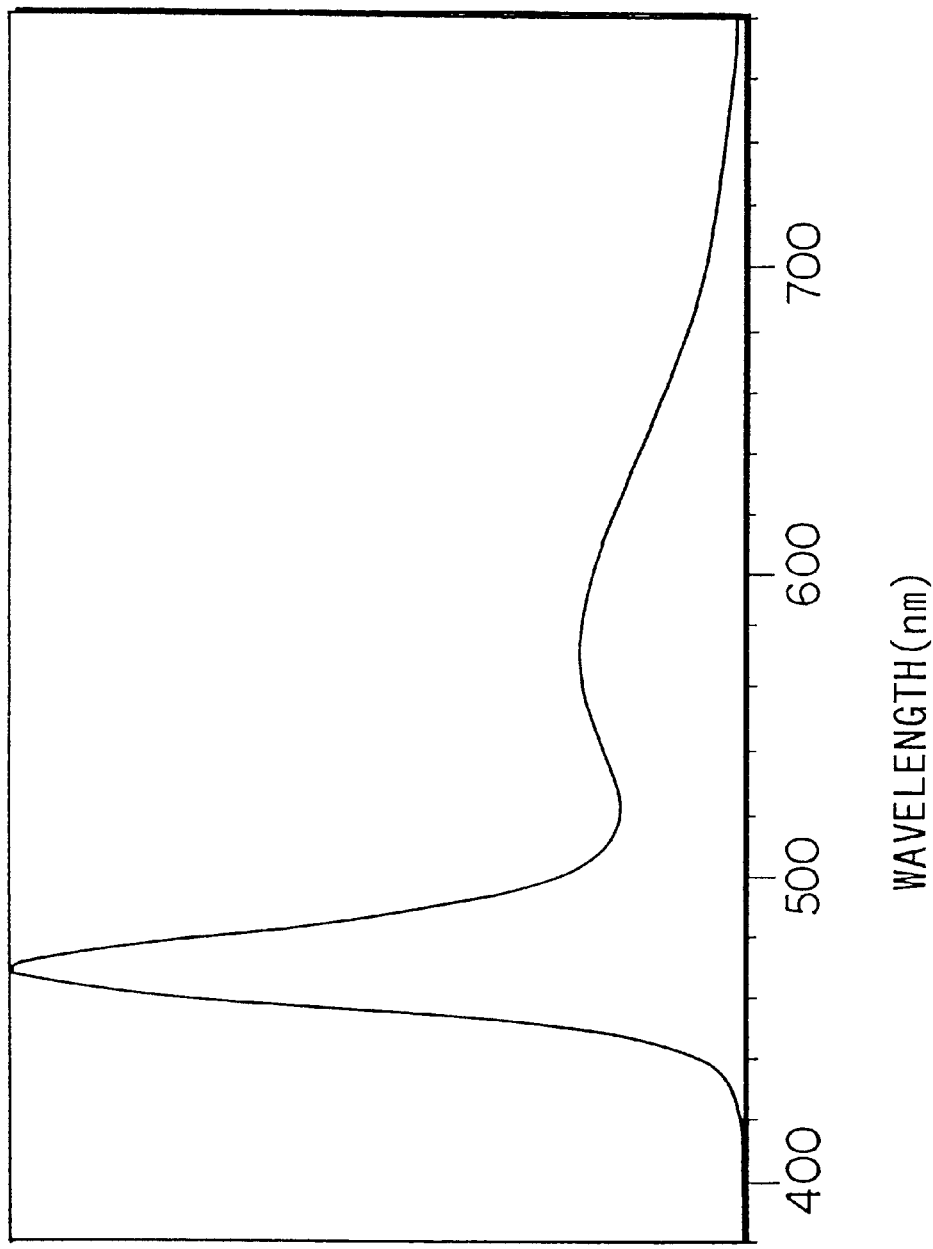
FIG. 8 is a graph showing a spectral wavelength when an elastic sheet containing a fluorescent substance is mounted on a blue LED in a production example 24.

Using the blue LED used in the production example 23, the above elastic sheet was mounted in a position 5 mm away from the blue LED, which was then turned on by applying a current of 20 mA. Upon measuring a light diffused by passing through the elastic sheet, a diffused white light defined by x=0.2667, y=0.2725 in the chromaticity coordinate systems and having a luminance of 1629 cd/m$^2$ was observed. The spectral wavelength at this time is shown in FIG. 8. In this example, the measurement was carried out not through the integrating sphere.

Production Example 25

0.2 parts of "Lumogen ORANGE F" (produced by BASF GmbH) which is a perylene fluorescent dye having a light gathering property were dispersed as fluorescent substance in silicone rubber, and a fluorescent color cap having a thickness of 0.5 mm was produced using a mold and a heat press.

Using the blue LED used in the production example 23, the above fluorescent color cap was mounted on the blue LED, which was then turned on by applying a current of 20 mA. As a result, a diffused white light defined by x=0.3405, y=0.3235 in the chromaticity coordinate systems and having a luminance of 2.124 cd/m$^2$ was observed. In this example, the measurement was carried out through the integrating sphere.

Production Example 26

0.2 parts of "Lumogen ORANGE F" (produced by BASF GmbH) which is a perylene fluorescent dye having a light gathering property were dispersed as fluorescent substance in silicone rubber, and a fluorescent color cap having a thickness of 0.5 mm was produced using a mold and a heat press.

Using the blue LED used in the production example 23, the above fluorescent color cap was mounted on the blue LED, which was then turned on by applying a current of 20 mA. As a result, a yellow green light defined by x=0.1859, y=0.6108 in the chromaticity coordinate systems and having a luminance of 2.708 cd/m$^2$ was observed. In this example, the measurement was carried out through the integrating sphere.

Production Example 27

40 parts of YAG fluophor used in the production example 23 were mixed and dispersed in silicone rubber, and a fluorescent color cap having a thickness of 0.6 mm was produced using a mold and a heat press. A lens-shaped cap made of silicone rubber having a transmittance of 80% or greater was mounted on a leading end portion of the fluorescent color cap. This fluorescent color cap was mounted on a blue LED, which was then turned on by applying a current of 20 mA. The chromaticity coordinates and luminance were measured from the front of the leading end portion of the LED. The measurement results are shown in TABLE-2. In this example, the measurement was carried out not through the integrating sphere.

TABLE-2

|  | X | y | Luminance (cd/m$^2$) |
|---|---|---|---|
| Cap Mounted | 0.3446 | 0.3482 | 3667 |
| Lens-Equipped Cap Mounted | 0.3348 | 0.3359 | 6239 |

By providing the lens at the leading end portion of the fluorescent-cap, the luminance of the light emitted from the front surface could be increased by about 70% without changing the luminescent color.

Production Example 28

12.5 parts of YAG fluophor (yttrium 28.0 wt %, aluminum 13.6 wt %, gadolinium 56.62 wt %, cerium 1.23 wt %) were dispersed as fluorescent substance in silicone rubber, and a fluorescent color cap having a thickness of 0.6 mm was produced using a mold and a heat press.

Using the blue LED used in the production example 23, the above fluorescent color cap was mounted on the blue LED, which was then turned on by applying a current of 20 mA. As a result, a diffused white light defined by x=0.3192, y=0.3375 in the chromaticity coordinate systems and having a luminance of 66.36 cd/m$^2$ was observed.

On the other hand, 0.03 parts of condensation azo dye were dispersed as a red coloring agent in silicone rubber, and a colored cap having a thickness of 0.5 mm was molded using a mold and a heat press.

Figure 9:
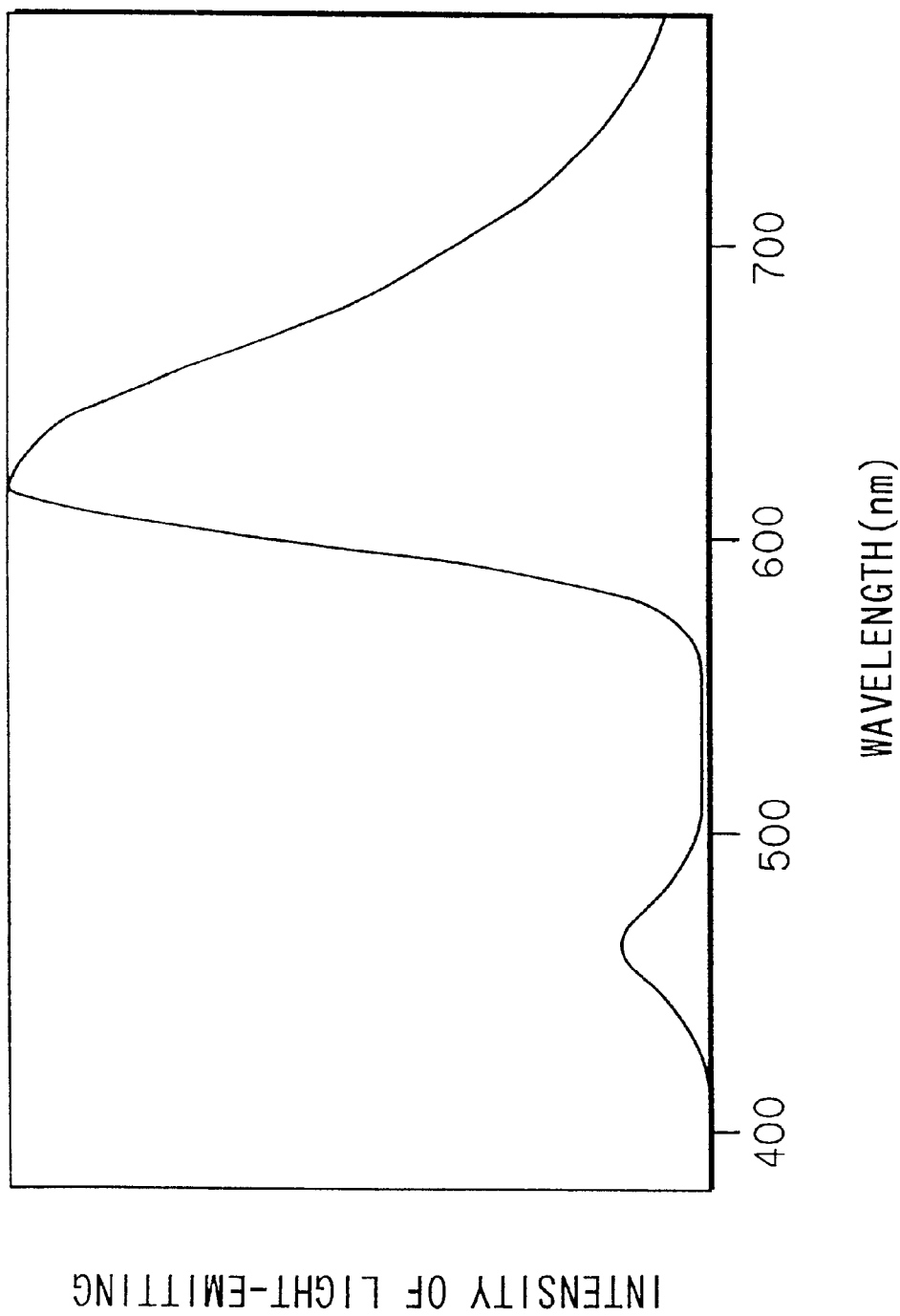
FIG. 9 is a graph showing a spectral wavelength when a colored cap is mounted in a production example 28.

This colored cap was mounted on the LED having the fluorescent color cap mounted thereon, and the LED was caused to emit a light. As a result, a diffused red light defined by x=0.5997, y=0.3081 in the chromaticity coordinate systems and having a luminance of 9.813 cd/m$^2$ was observed. The spectral wavelength at this time is shown in FIG. 9. In this example, the measurement was carried out through the integrating sphere.

Production Example 29

0.03 parts of phthalocyanine green were dispersed as a green coloring agent in silicone rubber, and a colored cap having a thickness of 0.5 mm was molded using a mold and a heat press.

Figure 10:
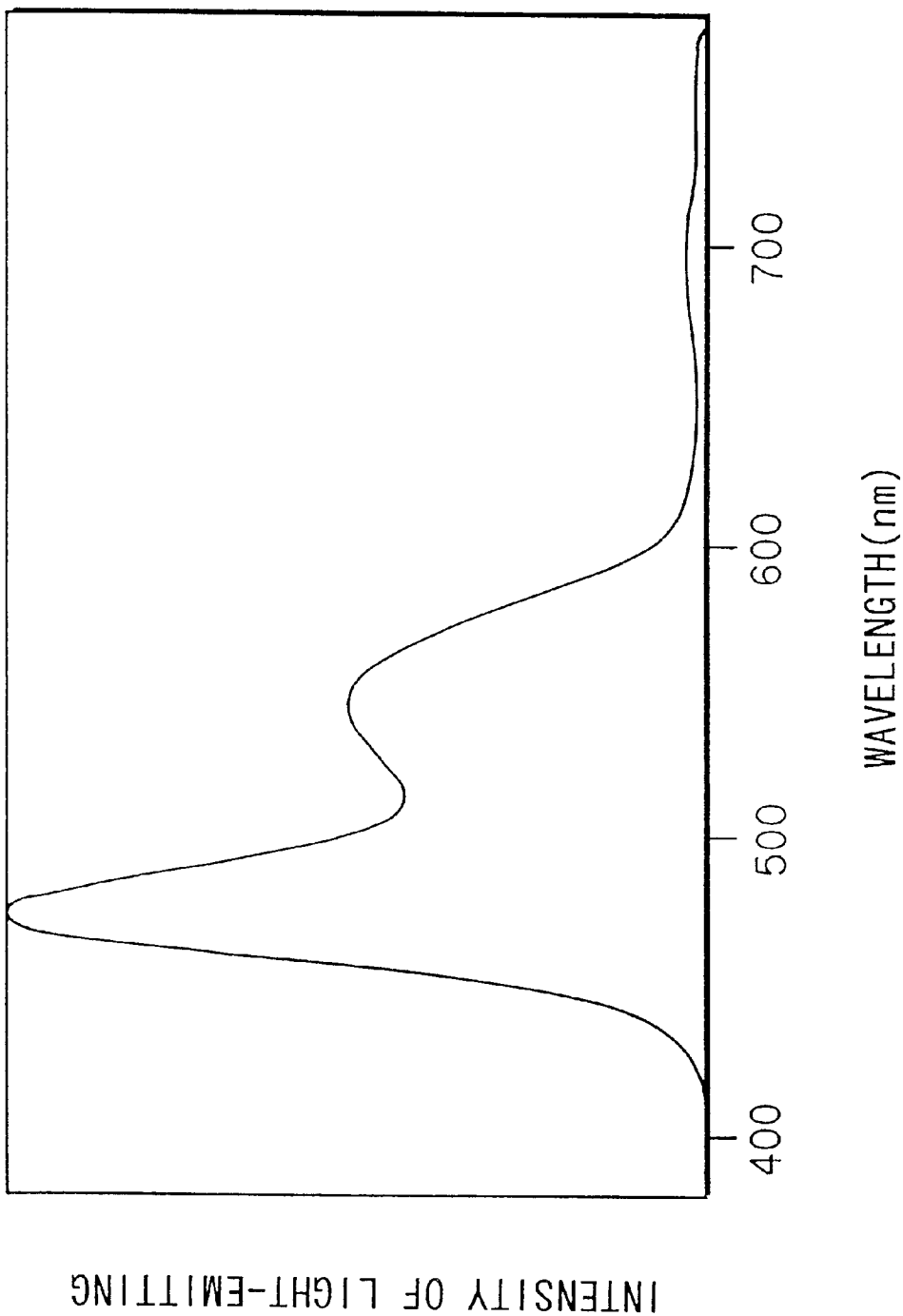
FIG. 10 is a graph showing a spectral wavelength when a colored cap is mounted in a production example 29.

Similar to the production example 28, this colored cap was mounted on the LED having the fluorescent color cap mounted thereon, and the LED was caused to emit a light. As a result, a diffused green light defined by x=0.2127, y=0.3702 in the chromaticity coordinate systems and having a luminance of 32.38 cd/m$^2$ was observed. The spectral wavelength at this time is shown in FIG. 10. In this example, the measurement was carried out through the integrating sphere.

Production Example 30

A colored cap was molded in the same way as in the production example 29 except that an amount of the green coloring agent in use was changed from 40 parts to 80 parts. This colored cap was mounted on the LED having the fluorescent color cap mounted thereon, and the LED was caused to emit a light. As a result, a diffused green light defined by x=0.1859, y=0.3971 in the chromaticity coordinate systems and having a luminance of 22.34 cd/m$^2$ was observed. In this example, the measurement was carried out through the integrating sphere.

Production Example 31

0.03 parts of phthalocyanine blue were dispersed as a blue coloring agent in silicone rubber, and a colored cap having a thickness of 0.5 mm was molded using a mold and a heat press.

Similar to the production example 28, this colored cap was mounted on the LED having the fluorescent color cap mounted thereon, and the LED was caused to emit a light. As a result, a diffused blue light defined by x=0.1236, y=0.1585 in the chromaticity coordinate systems and having a luminance of 10.19 cd/m$^2$ was observed. In this example, the measurement was carried out through the integrating sphere.

As is clear from the results of the production examples 28 to 31, a desired luminescent color can be obtained if a colored cap containing a coloring agent of a desired color is further mounted on the LED which is enabled to have a white luminescent color by mounting the fluorescent color cap.

Production Example 32

40 parts of YAG fluophor (yttrium 28.0 wt %, aluminum 13.6 wt %, gadolinium 56.62 wt %, cerium 1.23 wt %) as fluorescent substance and 0.03 parts of condensation azo dye as a red coloring agent were dispersed in silicone rubber, and a fluorescent color cap having a thickness of 0.5 mm was produced using a mold and a heat press.

Figure 11:
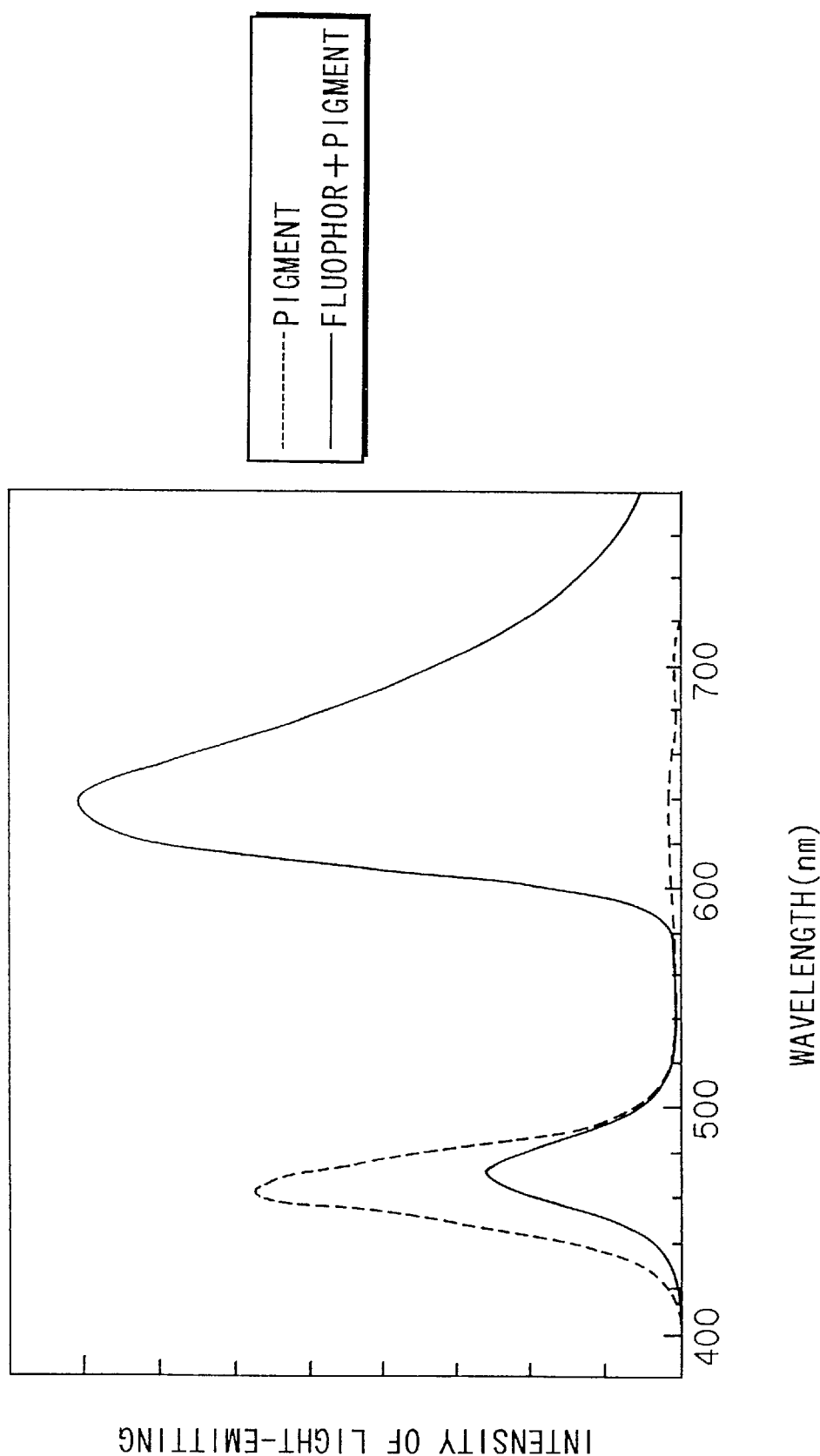
FIG. 11 is a graph showing a spectral wavelength when a fluorescent color cap is mounted in a production example 32.

This fluorescent color cap was mounted on a blue LED, which was then caused to emit a light. Then, a blue light defined by x=0.1275, y=0.0883 in the chromaticity coordinate systems and having a luminance of 2.895 cd/m$^2$ became a diffused red light having a color defined by x=0.5289, y=0.2542 and a luminance of 0.9259 cd/m$^2$ after the mounting of the cap. A luminous intensity in relation to wavelength at this time is shown in FIG. 11. In this example, the measurement was carried out through the integrating sphere.

As is clear from the production example 32, a desired luminescent color can also be obtained by containing a coloring agent of a desired color in the fluorescent color cap.

Production Example 33

23 parts of YAG fluophor (yttrium 28.0 wt %, aluminum 13.6wt %, gadolinium 56.62 wt %, cerium 1.23 wt %) were dispersed as fluorescent substance in silicone rubber, and a fluorescent color cap having a thickness of 0.35 mm was produced.

Using the blue LED used in the production example 23, the above cap was mounted on this blue LED, which was then turned on by applying a current of 20 mA. Lights emitted from the leading end portion and the side surface portion of the cap were measured by the spectrophotometer. The results are shown in TABLE-3. In this example, the measurement was carried out not through the integrating sphere.

TABLE-3

| Place of Measurement | X | y | Luminance (cd/m$^2$) |
|---|---|---|---|
| Leading End | 0.2346 | 0.2365 | 2954 |
| Side Surface | 0.3095 | 0.3389 | 2053 |

Next, 12 parts of YAG fluophor (yttrium 28.0 wt %, aluminum 13.6wt %, gadolinium 56.62 wt %, cerium 1.23 wt %) were dispersed as fluorescent substance in silicone rubber, and a sheet piece having a thickness of 035 mm was produced. After mounting this sheet piece on the leading end of the cap, the chromaticity was measured again by the spectrophotometer. The result is shown in TABLE-4.

TABLE-4

| Place of Measurement | X | y | Luminance (cd/m$^2$) |
|---|---|---|---|
| Leading End | 0.306 | 0.3355 | 2985 |

From these results, it can be seen that the chromaticity of the light diffused while passing through the coating member can be adjusted by changing the concentration of the fluorescent substance in the coating member.

Production Example 34

Using a blue LED having a diameter of 3 mm, the color of the light emitted from this LED was changed by changing a value of a current flowing into the LED. A fluorescent color cap (thickness: 0.6 mm) containing a specific amount of YAG fluophor was mounted, and the luminescent color and the luminance after the mounting of the cap were measured by the spectrophotometer. The measurement results are shown in TABLE-5. In this example, the measurement was carried out through the integrating sphere.

TABLE 5

| Current mA | x | Y | Luminance | Amount | x | y | Luminance |
|---|---|---|---|---|---|---|---|
| 5 | 0.1213 | 0.1063 | 9.71 | 5.0 | 0.2189 | 0.2320 | 14.11 |
|  |  |  |  | 10.0 | 0.2886 | 0.3165 | 20.51 |
|  |  |  |  | 15.0 | 0.3397 | 0.3767 | 23.85 |
| 10 | 0.1243 | 0.0972 | 16.48 | 5.0 | 0.2210 | 0.2216 | 29.85 |
|  |  |  |  | 10.0 | 0.2894 | 0.3076 | 40.66 |
|  |  |  |  | 10.5 | 0.2925 | 0.3105 | 43.39 |
|  |  |  |  | 15.0 | 0.3393 | 0.3694 | 43.67 |
| 20 | 0.1275 | 0.0883 | 28.95 | 5.0 | 0.2214 | 0.2132 | 53.23 |
|  |  |  |  | 10.0 | 0.2888 | 0.2991 | 70.99 |
|  |  |  |  | 11.0 | 0.2989 | 0.3102 | 78.56 |
|  |  |  |  | 15.0 | 0.3380 | 0.3612 | 81.28 |
| 30 | 0.1288 | 0.0848 | 38.51 | 5.0 | 0.2214 | 0.2094 | 71.30 |
|  |  |  |  | 10.0 | 0.2878 | 0.2957 | 96.22 |
|  |  |  |  | 11.5 | 0.3046 | 0.3124 | 111.00 |
|  |  |  |  | 15.0 | 0.3377 | 0.3577 | 109.99 |

From TABLE-5, it can be seen that, even if there is a variation in the luminescent color of the LED, the luminescent color can be adjusted within a specified range by mounting the fluorescent color cap containing the specific amount of flourescent substance.

As described above, according to the inventive coating member containing the flourescent substance, the luminescent color of the LED can be changed to a desired color including white by mounting this coating member on the LED.

Further, since the luminescent color is changed by exciting the wavelength of the light emitted from the LED by the fluorescent substance, a stable color balance can be obtained by a single LED. Further, since the cap-shaped coating member is molded, it is precise in dimension and easy to maintain. Furthermore, since this cap is directly mounted on the LED, no special space is necessary and can be mounted regardless of the shape of the LED.

Example 35

Effect of Adding Light Diffusion Substance (LDS) to CAP on Color Variation

Figure 13:
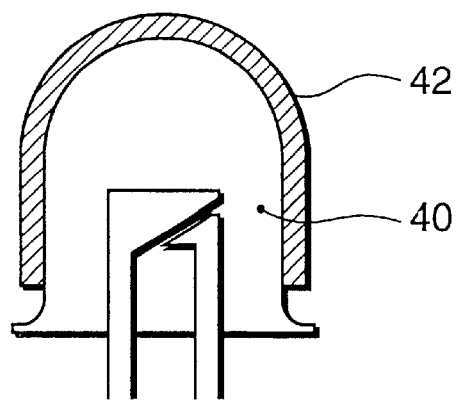
FIG. 13 is a cross sectional view showing a structure of a fluorescent color cap and a blue LED enclosed therein used for examples 35 through 39.

When a blue LED tip coated with a cap including a fluorescent material is illuminated, there likely occurs a color variation between a lead end and a side surface of a cap member as shown in FIG. 13. In general, the lead end portion becomes blue and the side portion becomes yellow. This variation is considered to be as a result of directionality of light emitted from LED. Specifically, at the lead end portion, a mixed color of light is observed including a yellow light absorbed and excited by the fluorescent material and a blue light advanced straight without being absorbed by the fluorescent material. On the other hand, at the side surface portion, only a diffused yellow light emitted from the fluorescent material is observed. This phenomenon becomes more significant as an amount of fluorescent material is reduced.

After various experiments, it was found that the addition of the diffusion material is effective to solve the above-described problem. In fact, adding and mixing a diffusion material with a fluorescent material in a polymer gives an effect of reducing the color variation. This is because a blue light passing through the fluorescent material (without being absorbed in) is diffused by the diffusing materials in the polymer, thereby reducing the color variation.

The following experiments have been conducted to confirm the above statements.

The luminance on a surface of a lead end of LED cap samples as described in Table 6 was measured at three positions, namely, directly in front-center, 45 degrees left of front-enter, and 45 degrees right of front-center (see FIG. 14) while each LED was illuminated with a current of 2 mA. A color luminance device BM-5A type, a product of TOPCON, with a light reduction filter was used as the measuring device.

TABLE 6

| Material | Sample 1 | Sample 2 | Sample 3 |
|---|---|---|---|
| Silicone rubber | 100 | 100 | 100 |
| Curing agent | 0.8 | 0.8 | 0.8 |
| YAG fluophor*1 | 10 | 10 | 10 |
| LDS($CaCO_3$)*2 | none | 5 | 10 |
|  | (Unit in Parts) |  |  | where
(*1)YAG fluophor: $Y_3Al_5O_{12}$:Ce
(*2)LDS: 97 wt % or more of Calcium carbonate; 3% or less of barium stearate

TABLE 7

| Sample Name | Color | | | Color Variation |
|---|---|---|---|---|
|  | Left (45 deg) | Front | Right (45 deg) |  |
| Sample 1 | x = 0.3110 | x = 0.2273 | x = 0.3062 | x1 = 0.0837 |
|  | Y = 0.3374 | y = 0.2041 | y = 0.3293 | y1 = 0.1333 |
| Sample 2 | x = 0.3132 | X = 0.2865 | x = 0.3124 | x2 = 0.0267 |
|  | y = 0.3406 | y = 0.2976 | y = 0.3423 | y2 = 0.0447 |
| Sample 3 | x = 0.3355 | x = 0.3163 | x = 0.3292 | x3 = 0.0192 |
|  | y = 0.3773 | y = 0.3473 | y = 0.3680 | y3 = 0.0300 |

Calculation of color variation for example 2 (w.r.t. sample 1) is as follows:

$$=[(x1+y1)-(x2+y2)]/(x1+y1)$$

$$=[(0.0837+0.1333)-(0.0267+0.0447)]/(0.0837+0.1333)$$

$$=0.67$$

$$=67\% \text{ color variation reduction}$$

The same calculation for Sample 3 (w.r.t. sample 1) is as follows:

$$=[(x1+y1)-(x3+y3)]/(x1+y1)$$

$$=[(0.0837+0.1333)(0.0192+0.0300)]/(0.0837+0.1333)$$

=0.77

=77% color variation reduction

From the above results shown in Table 7, it was confirmed that addition of a light-diffusion substance (LDS) reduced the color variation by about 67% in the case of sample 2 and 77% in the case of sample 3 respectively.

Example 36

Another Effect of the Addition of a Diffusion Substance (LDS) to a Cap Member

Another effect of the addition of an LDS to a cap member was found in the following experiments.

More specifically, it was found that adding a light diffusion substance enables a reduction in the amount of costly fluorescent material that is necessary to maintain the same level of chromaticity as in the case where fluorescent material is only added to a cap member. In other words, by adding the LDS, an amount of costly fluorescent material, that has a much higher market price than the LDS, can be reduced without significantly varying the level of chromaticity.

The effect of the addition of the light diffusion substance with respect to a fluorescent material (YAG fluophor) amount to silicone rubber was measured in accordance with the following procedures.

As a light source, a Blue LED E1L35-3B, a product of Toyota Gosei, was used and the current of 20 mA was supplied to the blue LED. As a measuring device, a spectrophotometer PR-704 was used. The shape of the sample that covers the Blue LED is defined as "A-3006" and is shown in FIG. 13. A Blue LED 40 having a 3 mm diameter was covered by a cap member 42 having a thickness of 0.35 mm. Then adjustment in terms of the parts of each component was made such that the sample exhibited the chromaticity at the same level as the one for a sample 1 (without a LDS), then the relative parts (%) of the each of the components of the cap were measured. Then a comparison was made between the four samples as shown in the following Table 8:

TABLE 8

| Material | Unit Price ($/kg) | Sample 1 | Sample 2 | Sample 3 | Sample 4 |
|---|---|---|---|---|---|
| Silicone rubber | $9.70 | 100 | 100 | 100 | 100 |
| Curing agent | $38.80 | 0.8 | 0.8 | 0.8 | 0.8 |
| YAG fluophor*1 | $1,456. | 9 | 7 | 6 | 5 |
| LDS(CaCO$_3$)*2 | $10.70 | none | 5 | 10 | 20 |

※Based on the exchange rate (¥103.00 = US$1.00)
(*1)YAG fluophor: Y$_3$Al$_5$O$_{12}$:Ce
(*2)LDS: 97 wt % or more of Calcium carbonate; 3% or less of barium stearate The chromaticity data for each sample is shown in Table 9.

TABLE 9

| | Sample 1 | Sample 2 | Sample 3 | Sample 4 |
|---|---|---|---|---|
| Chromaticity | L = 77.91 | L = 72.51 | L = 70.02 | L = 73.50 |
| | x = 0.3209 | x = 0.3279 | x = 0.3134 | x = 0.3142 |
| | y = 0.3942 | y = 0.3971 | y = 0.3789 | y = 0.3823 |

TABLE 9-continued

| | Sample 1 | Sample 2 | Sample 3 | Sample 4 |
|---|---|---|---|---|
| Unit Price ($/kg) | $ 128.5 | $ 99.7 | $ 84.3 | $ 67.5 |

※Based on the exchange rate (¥103.00 = US$1.00)

From the above Table 9, some degree of reduction of luminance in adding the LDS to the cap (samples 2 through 4) was observed in comparison to the sample 1, however, the reduced percentage in luminance is of no practical significance in actual use. On the other hand, the reduction of the unit price in comparison to the cap without the LDS (sample 1) was as much as 47.4% (sample 4) which is very significant in the production costs of the cap member.

Though the LDS consisting 97% or more of Calcium carbonate & 3% or less of barium stearate was used in the above samples 1–4, the LDS for this invention is not limited thereto. Other possible chemical compounds (or materials) can be used as the LDS. Basically a white filler that has a light diffusion effect such as: flower zinc; lead white; basic lead sulfate; lead sulfate; lithopone; zinc sulfide; titanium oxide; antimony oxide; calcium phosphate; calcium carbonate; aluminum silicate; magnesium silicate; calcium silicate; silica; magnesium oxide; magnesium carbonate; aluminum hydroxide; or magnesium hydroxide can be used.

A similar experiment that described above has also been conducted using the parts ratio as shown in the following samples 5 and 6. Note that the only difference from the above experiment is the fact that a curing agent was not used.

TABLE 8A

| | Sample 5 | Sample 6 |
|---|---|---|
| Silicone rubber | 100 | 100 |
| Curing agent | None | None |
| YAG fluophor*1 | 7 | 5 |
| LDS(CaCO$_3$)*2 | None | 3 |

(*1)YAG fluophor: Y$_3$Al$_5$O$_{12}$:Ce
(*2)LDS: 97 wt % or more of Calcium carbonate; 3% or less of barium stearate The chromaticity data for the above samples is shown in the following Table 9A.

TABLE 9A

| | Sample 5 | Sample 6 |
|---|---|---|
| Chromaticity | L = 105.5 | L = 102.4 |
| | x = 0.2930 | x = 0.2867 |
| | y = 0.3001 | y = 0.2926 |

From Table 8A and Table 9A, it can be seen that 7 parts of YAG fluophor can be reduced to 5 parts and the Sample 6 can still maintain substantially the same level of chromaticity. In other words, nearly a 28% saving in an amount of YAG fluophor becomes possible with the addition of the LDS. Accordingly, it can be concluded that addition of the LDS enables a reduction in the fluorescent material usage.

Example 37

Effect of the Addition of a Light-storing Pigment (LSP) on Afterglow

Afterglow is a phenomenon of maintaining a degree of luminance of an object in a dark room even after turning off the light. The following experiments were conducted to find out this effect in terms of the amount of LSP relative to other substances of the cap member.

Each of the LED caps, samples 1 through 3, was prepared in accordance with the parts ratio shown in Table 10:

TABLE 10

| Material | Sample 1 | Sample 2 | Sample 3 |
|---|---|---|---|
| Silicone rubber | 100 | 100 | 100 |
| Curing agent | 0.8 | 0.8 | 0.8 |
| YAG fluophor | 7.5 | 7.5 | 7.5 |
| LSP(***) | 5 | 10 | 20 |

LSP(***): strontium aluminate

The blue LED E1L33-3B402 made by Toyota Gosei was coated with above prepared LED cap member (samples 1 through 3) and placed in dark room where a current of 20 mA was supplied to the blue LED. After having illuminated the LED cap continuously for 10 minutes, the luminance on the surface of the LED cap was measured based on time with a color luminance device BM-5A type made by TOPCON.

Figure 14:
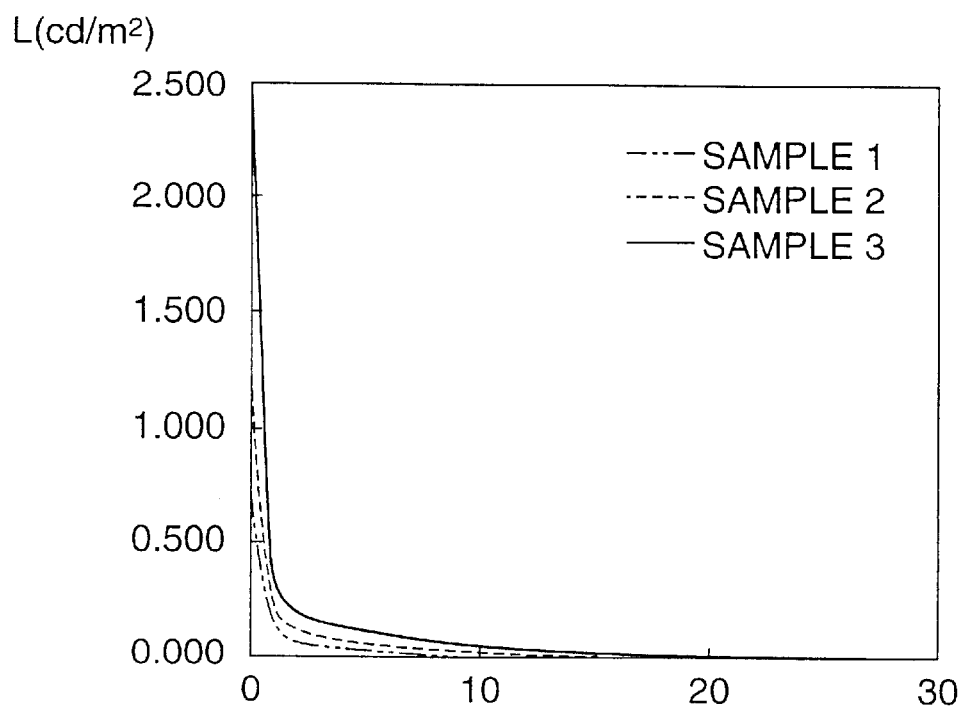
FIG. 14 is a graph showing an effect of afterglow by a light storing pigment mixed in a polymer of a cap member as in example 37.

The numerical results are shown in Table 11 and a graphical result is shown in FIG. 14.

TABLE 11

| Time (min) | 0 | 1 | 2 | 4 | 10 | 20 | 30 | 60 |
|---|---|---|---|---|---|---|---|---|
| Sample 1 | 0.752 | 0.107 | 0.063 | 0.036 | 0.011 | 0.008 | 0.004 | 0.002 |
| Sample 2 | 1.243 | 0.204 | 0.116 | 0.068 | 0.020 | 0.011 | 0.008 | 0.004 |
| Sample 3 | 2.258 | 0.356 | 0.208 | 0.148 | 0.048 | 0.021 | 0.013 | 0.007 |

(unit for Luminance in cd/m$^2$)

From the above results, a clear afterglow was observed for 4 minutes for all the samples after turning off the LED. A slight afterglow was observed for one hour after tuning off LED. It can be concluded that the more LSP that is added, the brighter and the longer afterglow can be observed.

In the above experiment, strontium aluminate was used as the LSP; the following chemical compounds (or materials) can also be used as well: zinc sulfide or calcium sulfide.

It should also be noted that the LSP can be added to the cap in addition to the LDS used in examples 35 and 36.

Examples 38 & 39

Figure 15:
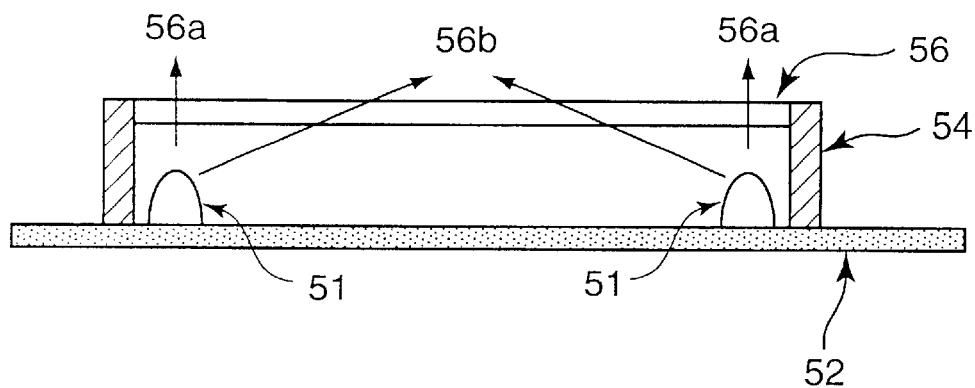
FIG. 15 is a diagram showing a color variation tendency depending upon a position of a surface of a flat faced display when a florescent color cap and an LED enclosed therein is used to emit light from a rear surface of the flat surface display as explained in example 38.

There is a possible application of an LED coated with a fluorescent cap lightening up from behind the flat surfaced display screen such as a liquid crystal display (LCD). FIG. 15 is a simplified drawing depicting the chromaticity variation occurring on the LCD 56 when the LED covered with a cap (LED-cap) 51 is used to light up the LCD 56 from its rear side. The LED caps 51 are mounted on a base 52 and a case 54 rest on a base 54 and a top end of the case 54 is covered with the LCD 56 to form a sealed space. If no adequate measures are taken, a dispersion of luminance and chromaticity naturally occurs depending upon the position of the flat surfaced display. As shown in FIG. 15, light coming through a top surface in the direction of 56a corresponds to a position above the LED-cap 50 and shows a strong blue color. Light coming toward a central portion 56b of the LCD 56 shows a stronger yellow color. In fact, the dispersion of chromaticity beyond some level would cause some problems in designing the mechanism. In order to reduce the dispersion of chromaticity throughout the entire surface of the LCD 56, the inventors of this application conducted further experiments.

The example 38 focuses on the effect of a sand-blast machining step performed on a surface of a cap on the light diffusion property. The example 39 focuses on applicability of the cap to a flat surfaced light source.

Example 38

Effect of the Sand-blasting Step on the Light Diffusion Property

The effect of applying a sand-blast step (or shot blast step) on the cap surface in terms of the light diffusion was evaluated. The samples used for this evaluation were made with the following materials shown in Table 12.

TABLE 12

| Name of Material | Part(phr) |
|---|---|
| Silicone rubber polymer | 100 |
| Curing agent | 0.8 |
| YAG fluophor | 7 |

The following samples were prepared for this experiment.
① A-2805: Inner and Outer ground
② A-2805K: Inner ground and Outer sand blasted at #100 level (see below *1)
③ A-2805K-I1: Inner sand blasted at #300 level, Outer sand blasted at #100 level
④ A-2805K-I2: Inner and Outer sand blasted at #100 level;
⑤ A-2805K-I3: Inner sand blasted at #30 level and Outer sand blasted at #100 level
where Inner: an inner surface of a cap;

Outer: an outer surface of a cap;

Ground: grind step performed on the surface;

Sand-blasted: sand blasting step performed on the surface;

(*1) See Abrasive Grain Size -JIS R 6001-1973

(1) (Measurement 38-I) For evaluation of the effects of the sand blast process applied to the surface(s) of the cap on luminance and chromaticity of a cap, as a light source, a Blue-LED of 3 mm diameter "E1L33-3B4022", a product of Toyota-Gosei, was used and the current of 20 mA was supplied to the blue LED. As a measurement device, a Photo Research spectro-radio-photometer PR-704 was used with a measurement jig: integrating sphere.

Figure 12:
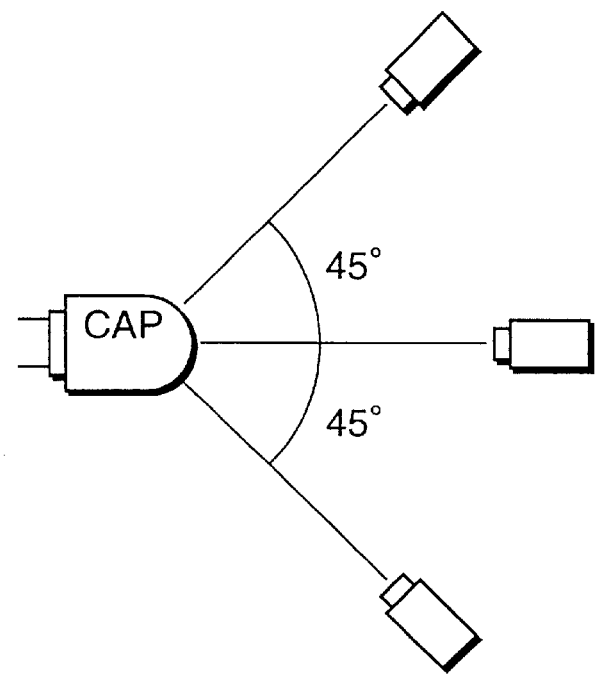
FIG. 12 is a diagram showing how a color variation of an LED is measured in examples 35 and 38.

(2) (Measurement 38-II) For evaluation of the effects of the sand-blast process applied to the surface (s) of the cap on the light diffusion character, as a light source a Blue-LED of 3 mm diameter, "E1L33-3B402", a product of Toyota-Gosei was used and a current of 20 mA was applied thereto. As a measurement device, a Topcon color photometer BM-5A with mesh-filter was used to measure the rubber surface at three positions, (a) front position; (b) 45 degree left; and (c) 45 degree right as shown in FIG. 12. The measurement results are shown in the following tables.

(1) Measurement Result 38-I

TABLE 13

| Type | Measured values |
|---|---|
| A-2805 | L = 84.54 |
|  | x = 0.3189 |
|  | y = 0.3831 |
| A-2805K | L = 85.12 |
|  | x = 0.3242 |
|  | y = 0.3904 |

TABLE 13-continued

| Type | Measured values |
|---|---|
| A-2805K-J1 | L = 85.02 |
|  | x = 0.3235 |
|  | y = 0.3901 |
| A-2805K-J2 | L = 85.11 |
|  | x = 0.3292 |
|  | y = 0.3969 |
| A-2805K-13 | L = 84.88 |
|  | x = 0.3201 |
|  | y = 0.3948 |

Unit (for L) = cd/m$^2$ (2) Measurement Result 38-II

TABLE 14

| Type\Position | front | 45 degree left | 45 degree right | #1 |
|---|---|---|---|---|
| A-2805 | L = 123.1 | L = 97.7 | L = 107.1 | ΔL = 25.4 |
|  | x = 0.2009 | x = 0.2894 | x = 0.2770 | Δx = 0.0885 |
|  | y = 0.2012 | y = 0.3409 | y = 0.3224 | Δy = 0.1397 |
| A-2805K | L = 121.0 | L = 100.6 | L = 99.9 | ΔL = 21.1 |
|  | x = 0.2142 | x = 0.2582 | x = 0.2903 | Δx = 0.0761 |
|  | y = 0.2182 | y = 0.2909 | y = 0.3398 | Δx = 0.1216 |
| A-2805K-I1 | L = 120.3 | L = 101.4 | L = 100.3 | ΔL = 20.0 |
|  | x = 0.2214 | x = 0.2956 | x = 0.2749 | Δx = 0.0742 |
|  | y = 0.2256 | y = 0.3470 | y = 0.3113 | Δy = 0.1214 |
| A-2805K-12 | L = 115.9 | L = 104.2 | L = 98.8 | ΔL = 17.1 |
|  | x = 0.2302 | x = 0.2805 | x = 0.2934 | Δx = 0.0632 |
|  | y = 0.2430 | y = 0.3250 | y = 0.3488 | Δy = 0.1058 |
| A2805K-I3 | L = 114.3 | L = 103.1 | L = 99.6 | ΔL = 14.7 |
|  | x = 0.2392 | x = 0.2905 | x = 0.2755 | Δx = 0.0513 |
|  | y = 0.2550 | y = 0.3452 | y = 0.3209 | Δy = 0.0902 |

1: Δluminance & Δchromaticity between front and 45 deg left & right

From the above results, it can be observed that a sand-blast step does not significantly affect the luminance and chromaticity but a blast step does show a positive effect on the light diffusion character. In particular, when comparing A-2805 with A-2805K-I1,I2,I3, on average, Δ luminance was reduced by 42% and Δ chromaticity was reduced by 38%. In summary, a blast step at #100 level is, particularly, effective to reduce the variation in luminance and in chromaticity.

Example 39

Application of LED Cap to a Flat Surfaced Light Source

It was found that adding a LDS to a cap member and applying a sand-blast machining step to the surface of LED cap member resulted in a reduction in color variation. However it was not clear that this effect was realized when applied to the flat surfaced light source. Thus the following experiment was conducted to find out the applicability of adding a LDS.

The following samples shown in Table 15 were prepared for this experiment.

TABLE 15

| Type | Materials | No.(added) phr | Shape |
|---|---|---|---|
| blank | Silicone rubber polymer | 100 | A3006 |
|  | Curing agent | 0.8 |  |
|  | YAG fluophor | 8 |  |

TABLE 15-continued

| Type | Materials | No.(added) phr | Shape |
|---|---|---|---|
| W/LDS | Silicone rubber polymer | 100 | A3006 |
|  | Curing agent | 0.8 |  |
|  | YAG fluophor | 8 |  |
|  | LDS(carbon carbonate) | 20 |  |
| W/blast step | Silicone rubber polymer | 100 | A-2805K-I2 |
|  | Curing agent | 0.8 |  |
|  | YAG fluophor | 8 |  |

Figure 16:
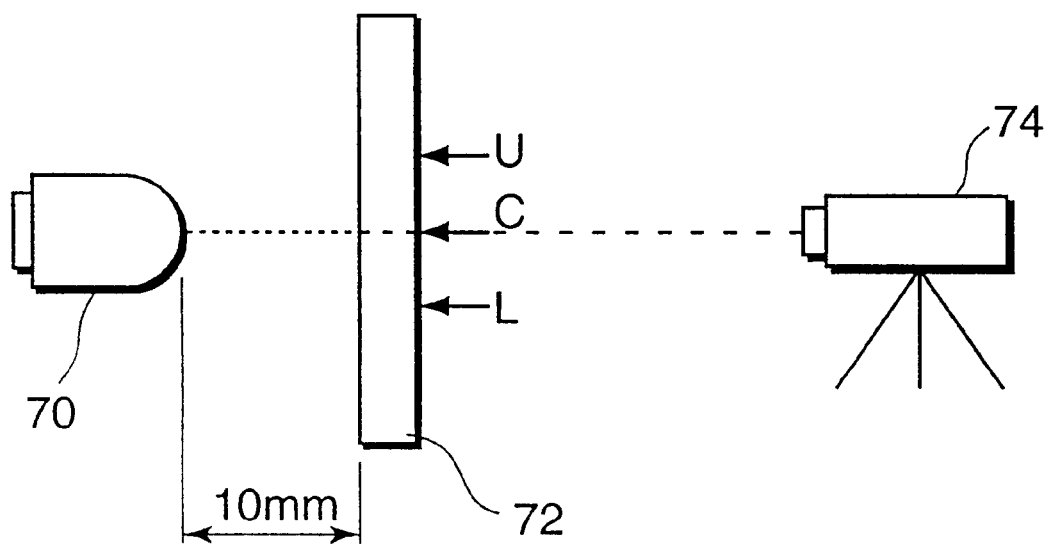
FIG. 16 is a diagram showing an experimental set used in example 39 to measure color variation.

Where
A-3006: Inner dia = 2.9mm  Height = 6.7mm  Surface ground
A-2805K-12: Inner dia = 2.8mm  Height = 5mm
Inner and Outer sand blasted at #100 level For an evaluation of variation in color and luminance, as a light source, a Blue LED of 3 mm diameter. "E1L33-3B402", a product of Toyota-Gosei was used and a current of 20 mA was supplied to the blue LED. As a measurement device, a Photo Research spectro-radio-photometer "PR-704" was used in accordance with FIG. 16. As shown in FIG. 16, a diffusion plate 72 was placed 10 mm away from an LED cap (an LED coated with a cap) 70 and a photometer 74 was positioned on the other side of diffusion plate 72. Then measurement was performed by the photometer 74 while the cap LED 70 was illuminated at three positions on the diffusion plate 72; namely, a center position at a horizontal level with the LED cap 70, an upper position which was 10 mm above the middle position, and a lower position which was 10 mm below the middle position.

The results are shown in the following Table 16:

TABLE 16

| Type | (a) Center | (b) 10mm above | (c) 10mm lower | ΔL (w.r.t center) |
|---|---|---|---|---|
| Blank | L = 106.8 | L = 62.1 | L = 74.8 | ΔL = 44.7 |
|  | x = 0.2549 | x = 0.2857 | x = 0.2878 | Δx = 0.0329 |
|  | y = 0.2909 | y = 0.3386 | y = 0.3385 | Δy = 0.0477 |
| W/LDS | L = 98.7 | L = 58.1 | L = 66.1 | ΔL = 40.6 |
|  | x = 0.3013 | x = 0.2959 | x = 0.3009 | Δx = 0.0054 |
|  | y = 0.3593 | y = 0.3537 | y = 0.3593 | Δy = 0.0056 |
| With a blast step | L = 106.8 | L = 62.1 | L =74.8 | ΔL = 44.4 |
|  | x = 0.2549 | x = 0.3100 | x = 0.3076 | Δx = 0.0277 |
|  | y = 0.3285 | y = 0.3698 | y = 0.3651 | Δy = 0.0412 |

Unit for L = cd/m$^2$

From the above results, it can be seen that applying a sand blast step to the inner and outer surfaces of the cap member reduces variation in chromaticity to some degree. However, this effect becomes highly significant with a cap member including a LDS. It, in fact, reduced variation in chromaticity by as much as 86%.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A method of producing a transparent coating member, comprising:
   providing a silicone rubber material and a fluorescent substance together in a manner so that a coating member is formed having an upper and a lower surfaces; and
   sand blasting at least one of the upper and lower surfaces.

2. The method of producing a transparent coating member according to claim 1, wherein said step of sand blasting is done at on both the upper and the lower surfaces.

3. A The method of producing a transparent coating member according to claim 2, wherein said step of sand blasting is done at a #100 level.

4. The method of producing a transparent coating as defined in claim 1, wherein said step of providing includes using a YAG fluophor and molding the silicone rubber and the YAG fluophor into a cap shape material in a die cast mold; and said method further comprising the step of:

removing the molded material from the die cast mold followed by said step of sand blasting, wherein said step of sand blasting includes sand blasting both the upper and the lower surfaces.

5. A molded transparent covering member having a size so as to be mountable on a housing of a light-emitting diode, comprising:

a molded main body, said molded main body including:
a fluorescent substance; and
a light diffusion substance.

6. A molded transparent covering member as defined in claim 5, wherein said light diffusion substance includes at least 97% of calcium carbonate and at most 3% of barium stearate.

7. A molded transparent covering member as defined in claim 5, wherein said light diffusion substance includes a material selected from a group consisting of flower of zinc; lead white; basic lead sulfate; lead sulfate; lithopone; zinc sulfide; titanium oxide; antimony oxide; calcium carbonate; calcium phosphate; aluminum silicate; magnesium silicate; calcium silicate; silica; magnesium oxide; magnesium carbonate; aluminum hydroxide; and magnesium hydroxide.

8. A molded transparent covering member as defined in claim 5, wherein said fluorescent substance includes a YAG fluophor.

9. A molded transparent covering member as defined in claim 5, wherein said fluorescent substance includes $Y_3Al_5O_{12}$:Ce.

10. A molded transparent covering member as defined in claim 5, further comprising a silicon rubber material and a curing agent.

11. A molded transparent covering member as defined in claim 5, wherein the light diffusion substance is included in an amount that is inversely proportional to an amount of the YAG fluophor.

12. A molded transparent covering member as defined in claim 5, wherein said molded main body has a recessed region formed in a surface of said molded main body.

13. A molded transparent covering member as defined in claim 5, wherein said molded main body has a size so as to provide a close contact fit when said molded transparent covering member is disposed on the housing of the light-emitting diode.

14. A transparent covering member to be disposed on a housing of a light-emitting diode, comprising:

a main body having a substantially U-shaped cross-section, said main body further including:
a fluorescent substance; and
a light diffusion substance.

15. A transparent covering member as defined in claim 14, wherein said light diffusion substance includes at least 97% of calcium carbonate and at most 3% of barium stearate.

16. A transparent covering member as defined in claim 14, wherein said light diffusion substance includes a material selected from a group consisting of flower of zinc; lead white; basic lead sulfate; lead sulfate; lithopone; zinc sulfide; titanium oxide; antimony oxide; calcium carbonate; calcium phosphate; aluminum silicate; magnesium silicate; calcium silicate; silica; magnesium oxide; magnesium carbonate; aluminum hydroxide; and magnesium hydroxide.

17. A transparent covering member as defined in claim 14, wherein said fluorescent substance includes a YAG fluophor.

18. A transparent covering member as defined in claim 14, wherein said fluorescent substance includes $Y_3Al_5O_{12}$:Ce.

19. A transparent covering member as defined in claim 14, further comprising a silicon rubber material and a curing agent.

20. A transparent covering member as defined in claim 14, wherein the light diffusion substance is included in an amount that is inversely proportional to an amount of the YAG fluophor.

21. A transparent covering member as defined in claim 14, wherein said main body has a recessed region formed in a surface of said main body.

22. A transparent covering member as defined in claim 14, wherein said main body has a size so as to provide a close contact fit when said transparent covering member is disposed on the housing of the light-emitting diode.

23. A transparent covering member to be disposed on a housing of a light-emitting diode, comprising:

a main body having at least one planar surface and at least one side edge, said main body further including:
a fluorescent substance; and
a light diffusion substance.

24. A transparent covering member as defined in claim 23, wherein said light diffusion substance includes at least 97% of calcium carbonate and at most 3% of barium stearate.

25. A transparent covering member as defined in claim 23, wherein said light diffusion substance includes a material selected from a group consisting of flower of zinc; lead white; basic lead sulfate; lead sulfate; lithopone; zinc sulfide; titanium oxide; antimony oxide; calcium carbonate; calcium phosphate; aluminum silicate; magnesium silicate; calcium silicate; silica; magnesium oxide; magnesium carbonate; aluminum hydroxide; and magnesium hydroxide.

26. A transparent covering member as defined in claim 23, wherein said fluorescent substance includes a YAG fluophor.

27. A transparent covering member as defined in claim 23, wherein said fluorescent substance includes $Y_3Al_5O_{12}$:Ce.

28. A transparent covering member as defined in claim 23, further comprising a silicon rubber material and a curing agent.

29. A transparent covering member as defined in claim 23, wherein the light diffusion substance is included in an amount that is inversely proportional to an amount of the YAG fluophor.

30. A transparent covering member as defined in claim 23, wherein said main body has a recessed region formed in a surface of said main body.

31. A transparent covering member as defined in claim 23, wherein said main body has a size so as to provide a close contact fit when said transparent covering member is disposed on the housing of the light-emitting diode.

32. A transparent covering member to be disposed on a housing of a light-emitting diode, comprising:

a main body having at least one textured surface, said main body further including:
a fluorescent substance; and
a light diffusion substance.

33. A transparent covering member as defined in claim 32, wherein said light diffusion substance includes at least 97% of calcium carbonate and at most 3% of barium stearate.

34. A transparent covering member as defined in claim 32, wherein said light diffusion substance includes a material selected from a group consisting of flower of zinc; lead white; basic lead sulfate; lead sulfate; lithopone; zinc sulfide; titanium oxide; antimony oxide; calcium carbonate; calcium phosphate; aluminum silicate; magnesium silicate; calcium silicate; silica; magnesium oxide; magnesium carbonate; aluminum hydroxide; and magnesium hydroxide.

35. A transparent covering member as defined in claim 32, wherein said fluorescent substance includes a YAG fluophor.

36. A transparent covering member as defined in claim wherein said fluorescent substance includes $Y_3Al_5O_{12}$:Ce.

37. A transparent covering member as defined in claim 32, further comprising a silicon rubber material and a curing agent.

38. A transparent covering member as defined in claim 32, wherein the light diffusion substance is included in an amount that is inversely proportional to an amount of the YAG fluophor.

39. A transparent covering member as defined in claim 32, wherein said main body has a recessed region formed in a surface of said main body.

40. A transparent covering member as defined in claim 32, wherein said main body has a size so as to provide a close contact fit when said transparent covering member is disposed on the housing of the light-emitting diode.

41. A molded transparent covering member to be disposed on a housing of a light-emitting diode, comprising:
a molded main body having a uniform thickness, said main body further including:
a fluorescent substance; and
a light diffusion substance.

42. A molded transparent covering member as defined in claim 41, wherein said light diffusion substance includes at least 97% of calcium carbonate and at most 3% of barium stearate.

43. A molded transparent covering member as defined in claim 41, wherein said light diffusion substance includes a material selected from a group consisting of flower of zinc; lead white; basic lead sulfate; lead sulfate; lithopone; zinc sulfide; titanium oxide; antimony oxide; calcium carbonate; calcium phosphate; aluminum silicate; magnesium silicate; calcium silicate; silica; magnesium oxide; magnesium carbonate; aluminum hydroxide; and magnesium hydroxide.

44. A molded transparent covering member as defined in claim 41, wherein said fluorescent substance includes a YAG fluophor.

45. A molded transparent covering member as defined in claim 41, wherein said fluorescent substance includes $Y_3Al_5O_{12}$:Ce.

46. A molded transparent covering member as defined in claim 41, further comprising a silicon rubber material and a curing agent.

47. A molded transparent covering member as defined in claim 41, wherein the light diffusion substance is included in an amount that is inversely proportional to an amount of the YAG fluophor.

48. A molded transparent covering member as defined in claim 41, wherein said molded main body has a size so as to provide a close contact fit when said molded transparent covering member is disposed on the housing of the light-emitting diode.

* * * * *